US007700983B2

(12) United States Patent
Popp et al.

(10) Patent No.: US 7,700,983 B2
(45) Date of Patent: Apr. 20, 2010

(54) TRANSISTOR, MEMORY CELL, MEMORY CELL ARRAY AND METHOD OF FORMING A MEMORY CELL ARRAY

(75) Inventors: Martin Popp, Dresden (DE); Juergen Faul, Radebeul (DE); Thomas Schuster, Dresden (DE); Jens Hahn, Dresden (DE)

(73) Assignee: Qimonda AG, Munich (DE)

( * ) Notice: Subject to any disclaimer, the term of this patent is extended or adjusted under 35 U.S.C. 154(b) by 0 days.

(21) Appl. No.: 11/300,853

(22) Filed: Dec. 15, 2005

(65) Prior Publication Data

US 2007/0138523 A1 Jun. 21, 2007

(51) Int. Cl.
  *H01L 27/108* (2006.01)
  *H01L 29/94* (2006.01)
(52) U.S. Cl. ............... 257/296; 257/301; 257/E27.091; 257/E27.092; 438/239
(58) Field of Classification Search ................. 257/296, 257/301, 330, E27.091, E27.092, E29.201, 257/E29.26
See application file for complete search history.

(56) References Cited

U.S. PATENT DOCUMENTS

| 2004/0036114 A1* | 2/2004 | Taylor et al. ................. 257/330 |
| 2005/0020086 A1 | 1/2005 | Kim et al. |
| 2005/0127422 A1* | 6/2005 | Hsiao et al. .................. 257/301 |
| 2006/0113588 A1* | 6/2006 | Wu ............................. 257/330 |
| 2006/0134858 A1* | 6/2006 | Yamazaki .................... 438/243 |
| 2006/0270151 A1* | 11/2006 | Lee ............................. 438/243 |
| 2006/0270176 A1* | 11/2006 | Lee et al. ..................... 438/386 |

FOREIGN PATENT DOCUMENTS

| JP | 05048090 | 2/1993 |
| JP | 2000183337 | 6/2000 |

OTHER PUBLICATIONS

J.Y. Kim et al., "The Breakthrough in Data Retention Time of DRAM using Recess-Channel-Array Transistor (RCAT) for 88nm Feature Size and Beyond," Symposium on VLSI Technology Digest of Technical Papers, pp. 2, (2003).
Chinese Office Action for Patent Application No. 200610173280.1 mailed Aug. 6, 2008 (5 pages).

\* cited by examiner

*Primary Examiner*—Sue A Purvis
*Assistant Examiner*—Leslie Pilar Cruz
(74) *Attorney, Agent, or Firm*—Dicke, Billig & Czaja, PLLC

(57) ABSTRACT

One embodiment of the present invention relates to a transistor that is at least partially formed in a semiconductor substrate having a surface. In particular, the transistor includes a first source/drain region, a second source/drain region, a channel region connecting said first and second source/drain regions. Said channel region is disposed in said semiconductor substrate. A channel direction is defined by a line connecting said first and said second source/drain regions. A gate groove is formed in said semiconductor substrate. Said gate groove is formed adjacent to said channel region. Said gate groove includes an upper portion and a lower portion, said upper portion being adjacent to said lower portion, and a gate dielectric layer disposed between said channel region and said gate groove. The lower portion of said gate groove is filled with polysilicon whereas the upper portion of said gate groove is filled with a metal or a metal compound thereby forming a gate electrode disposed along said channel region. Said gate electrode controls an electrical current flowing between said first and second source/drain regions.

25 Claims, 18 Drawing Sheets

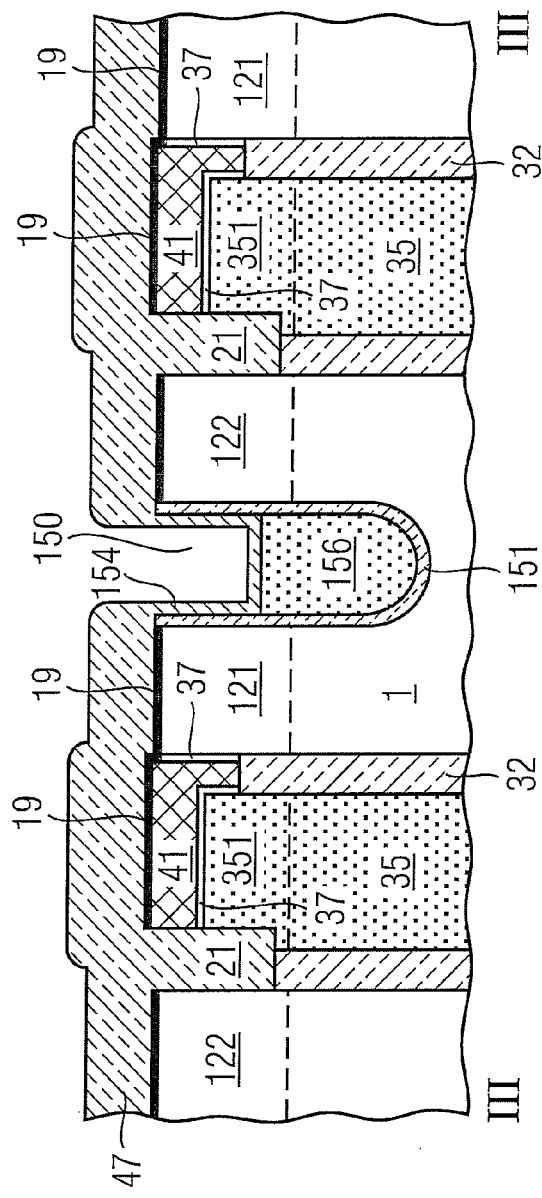
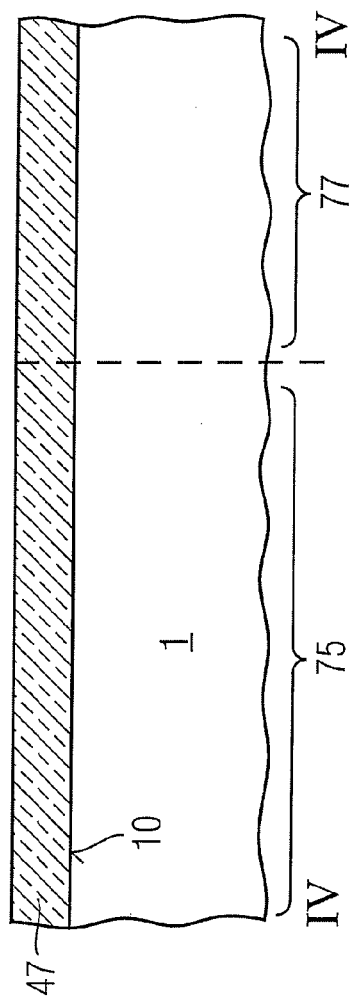
FIG 8A
FIG 8B

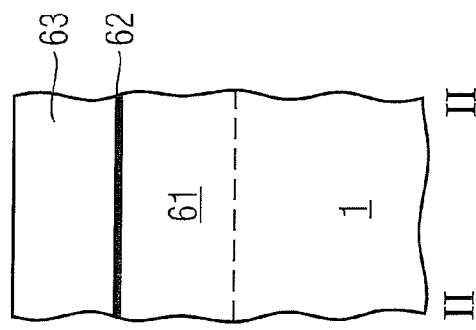
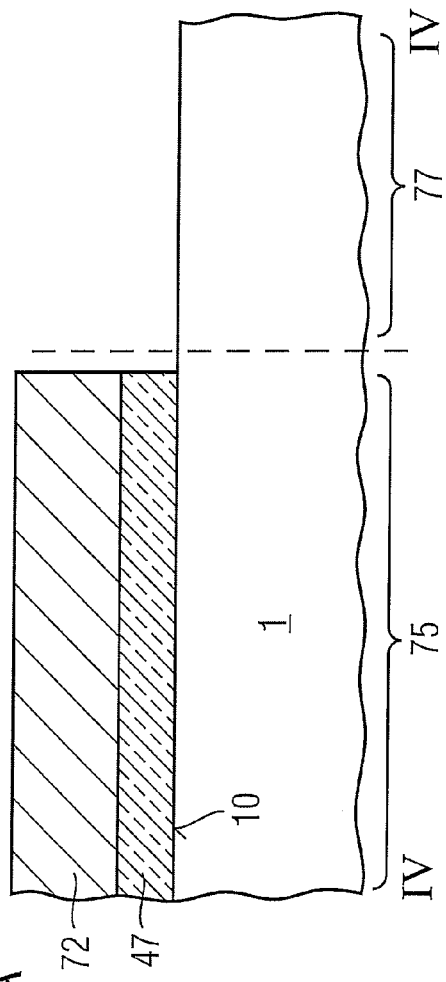
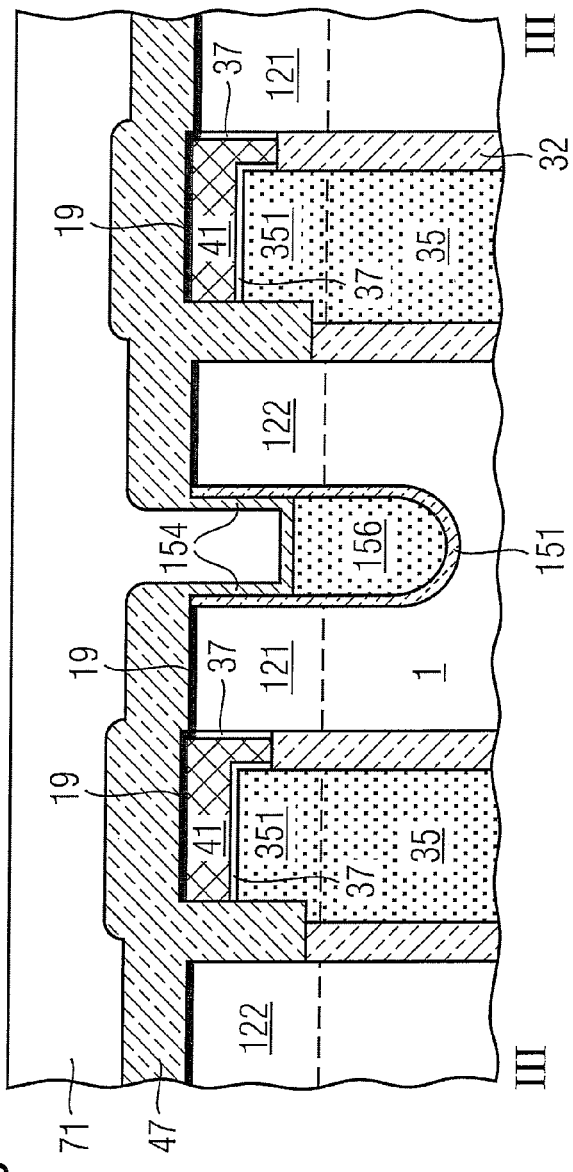

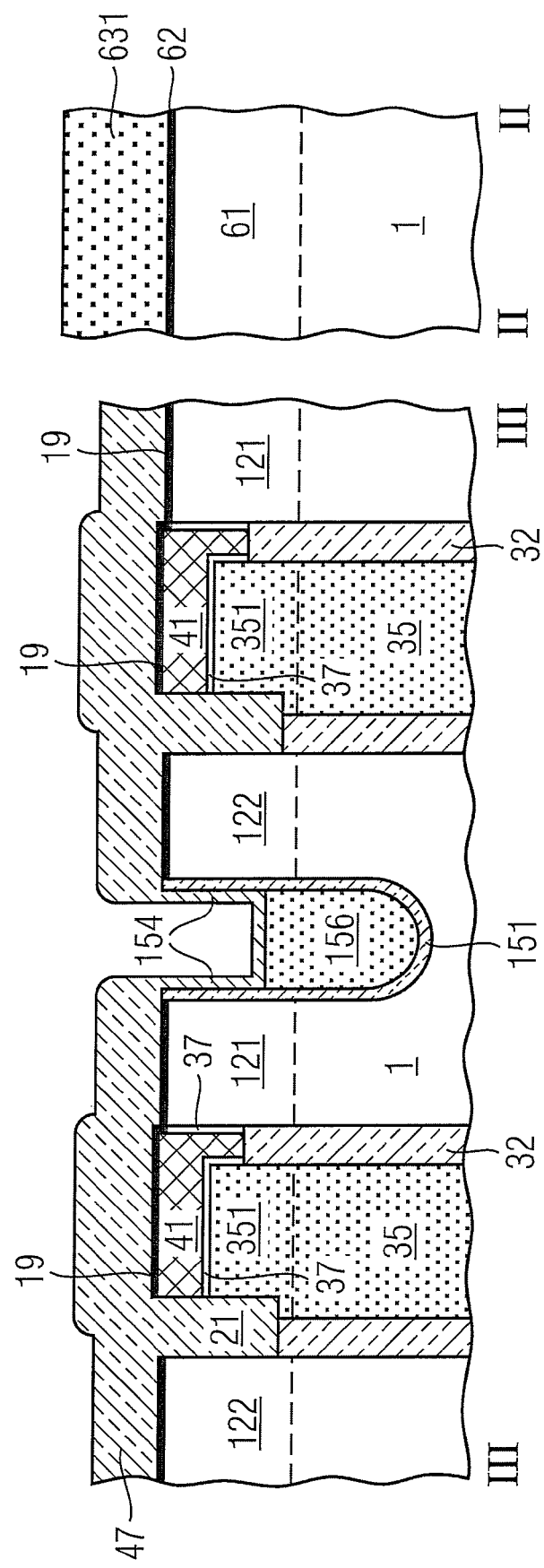

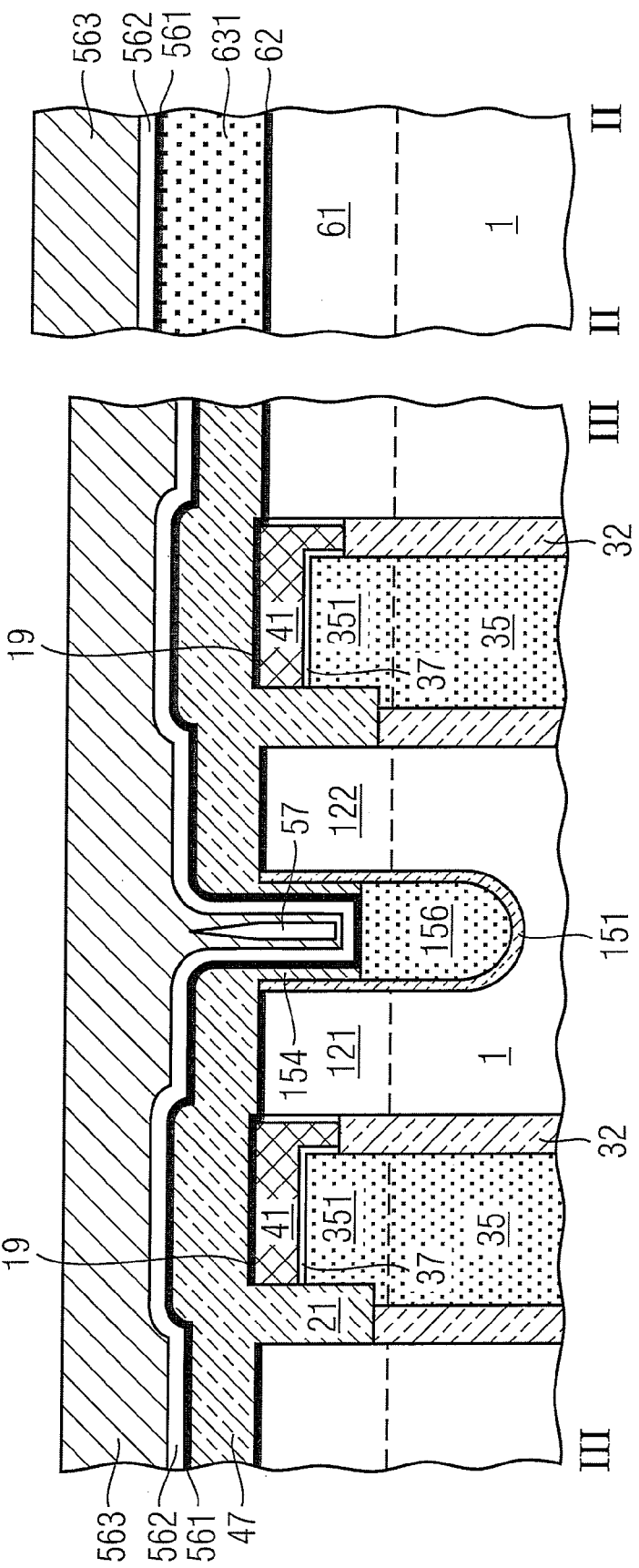

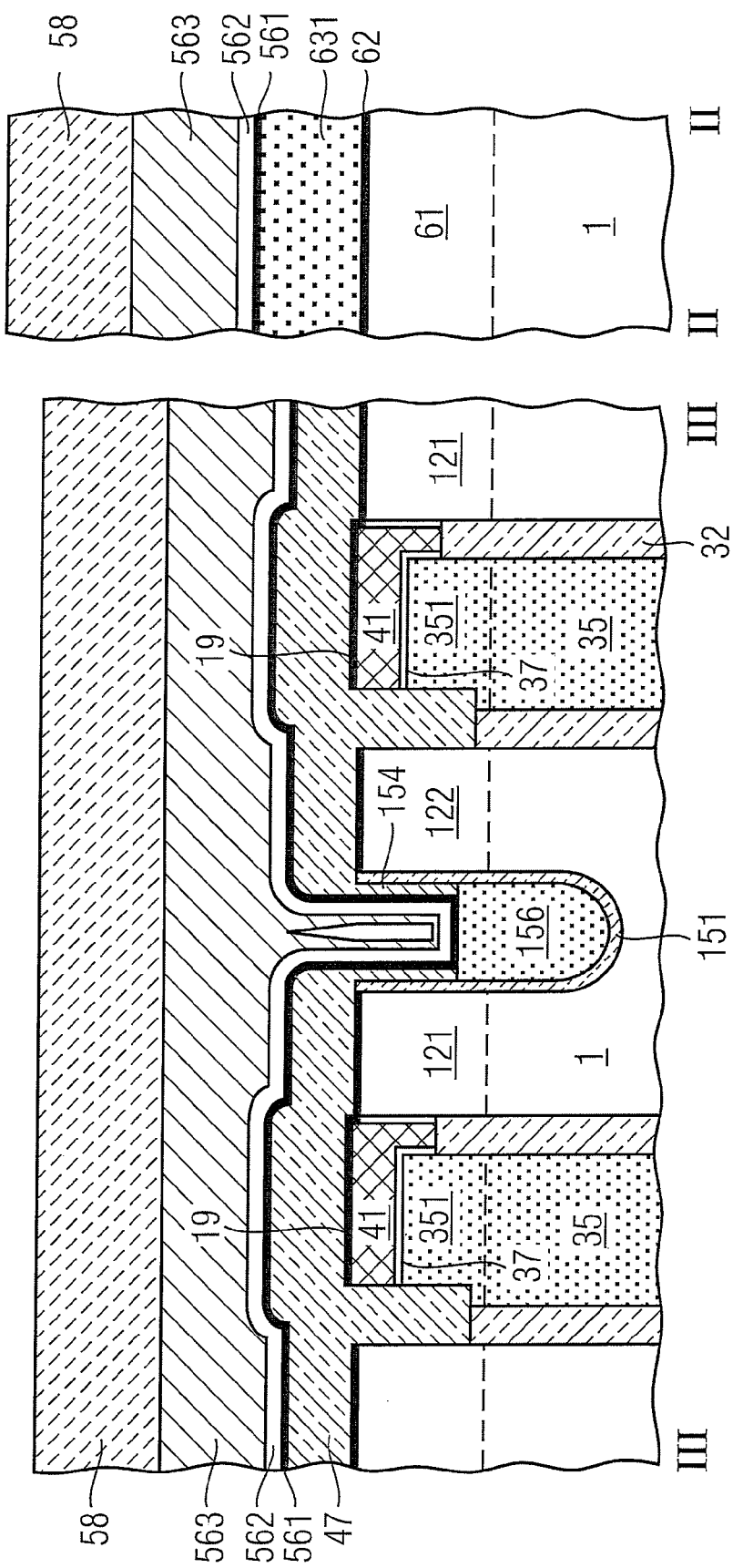

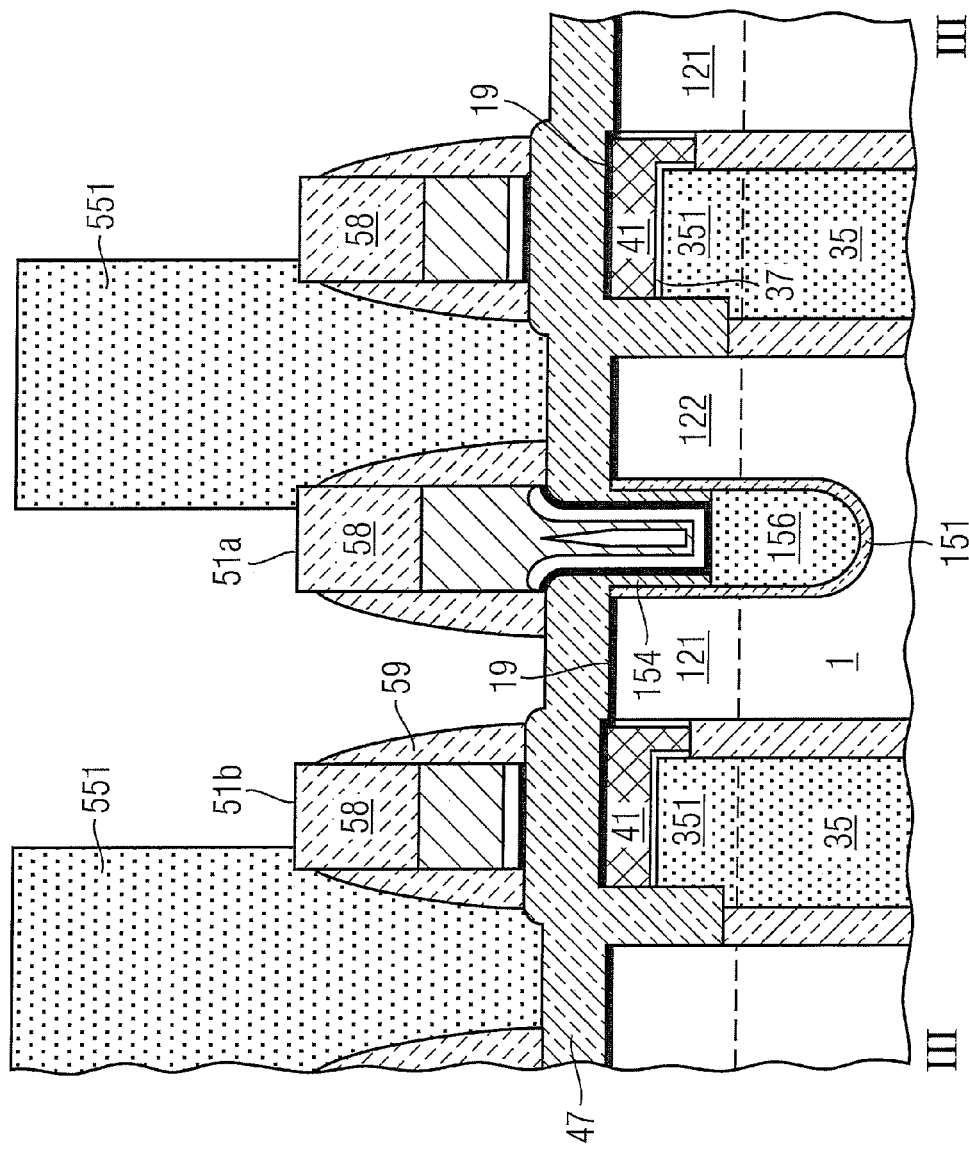
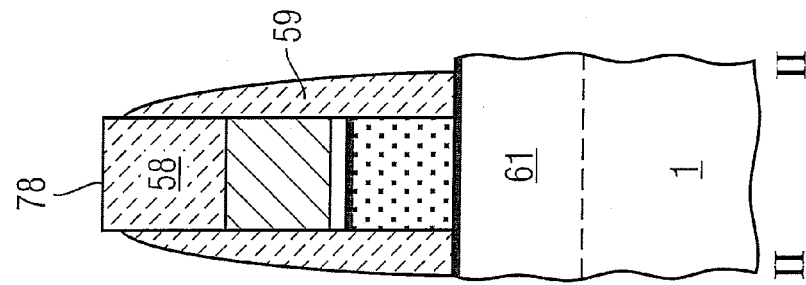

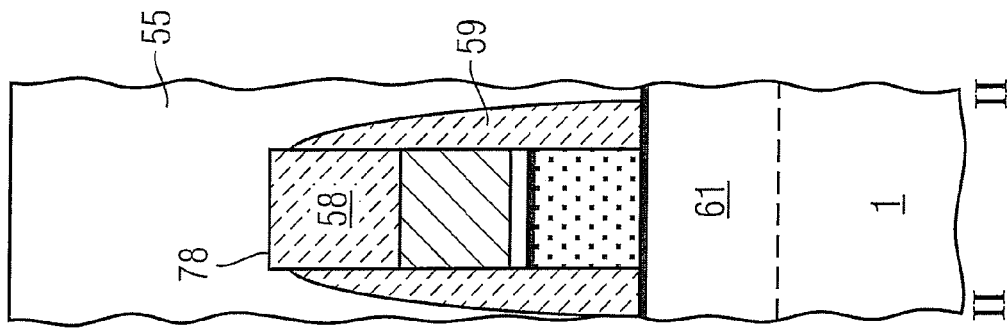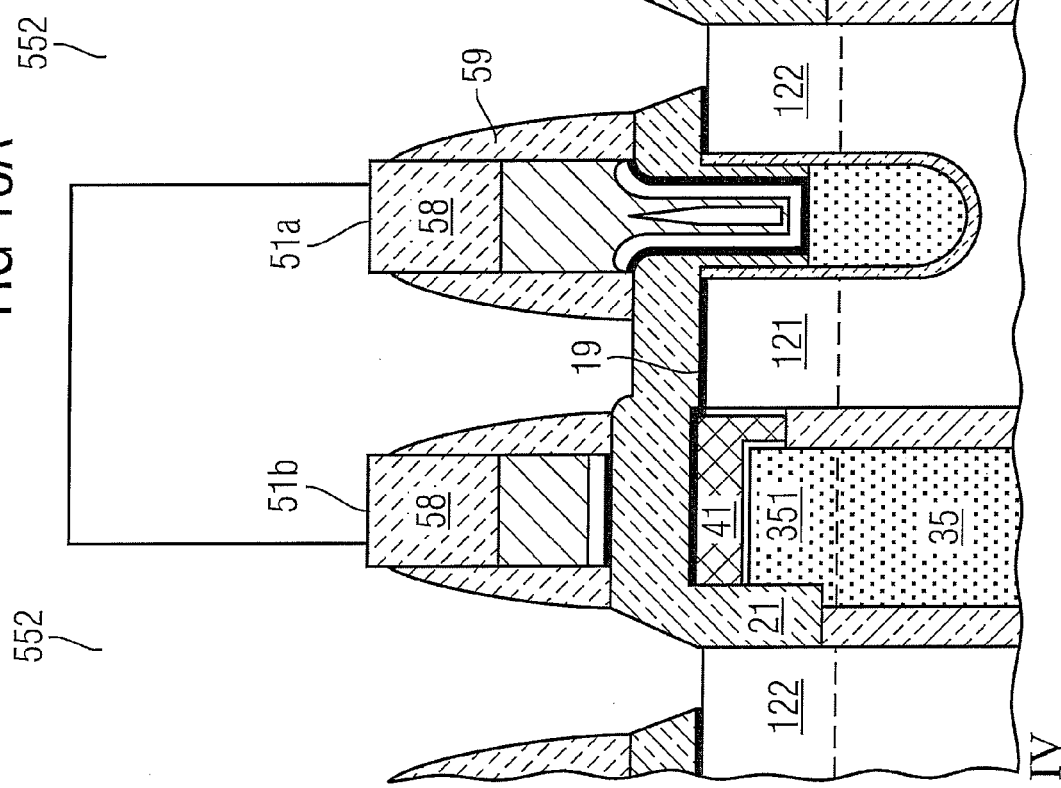

TRANSISTOR, MEMORY CELL, MEMORY CELL ARRAY AND METHOD OF FORMING A MEMORY CELL ARRAY

FIELD OF THE INVENTION

The invention relates to a transistor, a memory cell as well as a memory cell array with a plurality of memory cells such as dynamic random access memory (DRAM) cells. The invention further relates to a method of forming such a memory cell array.

BACKGROUND

Memory cells of a dynamic random access memory (DRAM) generally include a storage capacitor for storing an electrical charge that represents information to be stored, and an access transistor connected with the storage capacitor. The access transistor includes first and second source/drain regions, a channel connecting the first and second source/drain regions and a gate electrode controlling an electrical current flowing between the first and second source/drain regions. The gate electrode is electrically insulated from the channel by a gate dielectric. The transistor is usually partially formed in a semiconductor substrate, such as a silicon substrate. The portion, in which the transistor is formed, generally is denoted as the active area.

In conventional DRAM memory cell arrays, the gate electrode forms part of a word line. By addressing the access transistor via the corresponding word line, the information stored in the storage capacitor is read out.

In currently-used DRAM memory cells, the storage capacitor is implemented as a trench capacitor in which the two capacitor electrodes are disposed in a trench that extends into the substrate in a direction perpendicular to the substrate surface. According to another implementation of DRAM memory cell, the electrical charge is stored in a stacked capacitor which is formed above the surface of the substrate.

The access transistor is, for example, implemented as a planar transistor, in which the channel extends horizontally along the surface of the semiconductor substrate.

A known DRAM cell has a grooved transistor in which the gate electrode is disposed in a groove that extends in the substrate. Thereby, a current flowing from the first to the second source/drain regions and vice versa has horizontal and vertical components perpendicular to the substrate surface. This is further described in "The Breakthrough in data retention time of DRAM using Recess-Channel-Array transistor (RCAT) for 88 nm feature size and beyond", J. Y. Kim et al., 2003 Symposium on VLSI Technology Dig. of Tech. Papers. A further improvement of this transistor is also known.

In particular, US Pat. Appl. US 2005/0020086 A1 discloses a transistor comprising a gate electrode which is formed in a gate groove. In particular, inner sidewall spacers are provided which are formed on sidewalls of the recessed trench so that the center portion of the gate has a smaller width than an upper portion and a lower portion of the gate electrode. By including the sidewall spacers, the influence of the gate electrode on the first and second source/drain regions can be reduced, resulting in a reduced leakage current. However, due to the smaller width of the center portion of the gate electrode, the problem arises, that a contact resistance between the upper portion and the lower portion of the gate electrode and, in particular, the resistance between the corresponding word line and the lower portion of the gate electrode is increased, resulting in a degraded speed performance.

A method of forming special contact plugs is also known.

Memory devices usually comprise a memory cell array and a peripheral portion. The peripheral portion includes support circuitry for operating the memory cell array and, in particular, sense amplifiers and word line drivers.

SUMMARY

According to one embodiment of the present invention, an improved transistor is at least partially formed in a semiconductor substrate having a surface, and the transistor comprises a first source/drain region, a second source/drain region, a channel region connecting said first and second source/drain regions. Said channel region is disposed in said semiconductor substrate. A channel direction is defined by a line connecting said first and said second source/drain regions. A gate groove is formed in said semiconductor substrate. Said gate groove is formed adjacent to said channel region. Said gate groove comprises an upper portion and a lower portion, said upper portion being adjacent to said lower portion. A gate dielectric layer is disposed between said channel region and said gate groove. The lower portion of said gate groove is filled with polysilicon whereas the upper portion of said gate groove is filled with a metal or a metal compound thereby forming a gate electrode disposed along said channel region. Said gate electrode controls an electrical current flowing between said first and second source/drain regions.

In one case, the transistor further comprises sidewall spacers made of an insulating material, said sidewall spacers being formed on the sidewalls of the gate groove. In particular, due to the presence of the sidewall spacers, the influence of the electrical potential applied to the gate electrode and, consequently, a leakage current can be reduced.

According to an embodiment of the present invention, the channel region comprises a fin-region in which the channel has the shape of a ridge, said ridge comprising a top side and two lateral sides in a cross section perpendicular to said channel direction. Said top side has a width w and said lateral sides have a depth d. Said top side is disposed beneath a surface of said semiconductor substrate and said gate electrode is disposed along said top side and said two lateral sides.

One embodiment of the present invention further provides a memory cell comprising a storage capacitor comprising a storage electrode, a counter electrode and a capacitor dielectric disposed between said storage electrode and said counter electrode, and a transistor being formed at least partially in a semiconductor substrate having a surface. Said transistor comprises a first source/drain region, a second source/drain region, a channel region connecting said first and second source/drain regions. Said channel region is disposed in said semiconductor substrate, a channel direction being defined by a line connecting said first and said second source/drain regions, a gate groove being formed in said semiconductor substrate. Said gate groove is formed adjacent to said channel region. Said gate groove comprises an upper portion and a lower portion, said upper portion being adjacent to said lower portion, and a gate dielectric layer disposed between said channel region and said gate groove. The lower portion of said gate groove is filled with polysilicon whereas the upper portion of said gate groove is filled with a metal or a metal compound, thereby forming a gate electrode disposed along said channel region. Said gate electrode controls an electrical current flowing between said first and second source/drain regions, wherein said first source/drain region of said transistor is connected with said storage electrode of said memory cell.

In one case, said first source/drain region of said transistor is connected with said storage electrode of said memory cell by a contact strap having an upper surface and a lower surface, wherein the upper surface of the contact strap is disposed above the substrate surface and the lower surface of the contact strap is disposed beneath the substrate surface. Accordingly, the contact strap is disposed near the substrate surface. As a consequence, the topology of the resulting surface is improved. To be more specific, the contact strap is protruding only to a small extent.

One embodiment of the present invention further provides a memory cell array comprising a plurality of memory cells, a plurality of bitlines that are arranged in a first direction and a plurality of wordlines that are arranged in a second direction intersecting said first direction. Each of said memory cells comprises a storage capacitor, a transistor that is at least partially formed in a semiconductor substrate, said transistor comprising a first source/drain region that is connected with an electrode of said storage capacitor, a second source/drain region, a channel region connecting said first and second doped regions, said channel region being disposed in said semiconductor substrate, a gate groove being formed in said semiconductor substrate, said gate groove being formed adjacent to said channel region, said gate groove comprising an upper portion and a lower portion, said upper portion being adjacent to said lower portion, and a gate dielectric layer disposed between said channel region and said gate groove. The lower portion of said gate groove is filled with polysilicon whereas the upper portion of said gate groove is filled with a metal or a metal compound, thereby forming a gate electrode disposed along said channel region. Said gate electrode controls an electrical current flowing between said first and second source/drain regions. Each of said wordlines is electrically connected with a plurality of gate electrodes. Said second source/drain region of each of said transistors is connected with one of said bitlines via a bitline contact.

A method of forming a memory cell according to one embodiment of the present invention comprises the steps of providing a semiconductor substrate having a surface, providing a plurality of storage capacitors for storing information, providing a plurality of gate, electrodes, and providing a plurality of first and a second source/drain regions in the semiconductor substrate. A channel is formed between each of said first and a corresponding one of said second source/drain regions. Each of said first source/drain regions is connected with a storage electrode of a corresponding one of said storage capacitors. The step of providing the gate electrode comprises the steps of defining a gate groove in said substrate so that finally a gate groove extends from said surface of said semiconductor substrate in a direction perpendicular to said surface of said semiconductor substrate. Said gate groove comprises an upper portion and a lower portion, said upper portion being adjacent to said lower portion, providing a gate dielectric at an interface between said semiconductor substrate and said gate groove, and filling the lower portion of the gate groove with polysilicon and filling the upper portion of the gate groove with a metal or a metal compound.

BRIEF DESCRIPTION OF THE DRAWINGS

Features of the invention will become more readily apparent from a consideration of the following detailed description set forth with reference to the accompanying drawings which specify and show preferred embodiments of the invention, wherein like elements are designated by the same references throughout the drawings.

FIGS. 2 to 17 illustrate steps of manufacturing a memory cell array starting from the structure illustrated in FIG. 1.

DETAILED DESCRIPTION

In the following detailed description, reference is made to the accompanying drawings, which form a part thereof and in which are illustrated by way of illustration specific embodiments in which the invention may be practiced. In this regard, directional terminology such as "top", "bottom", "front", "back", "leading", "trailing", etc., is used with reference to the orientation of the Figures being described. Because components of embodiments of the present invention can be positioned in a number of different orientations, the directional terminology is used for purposes of illustration and in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1A:
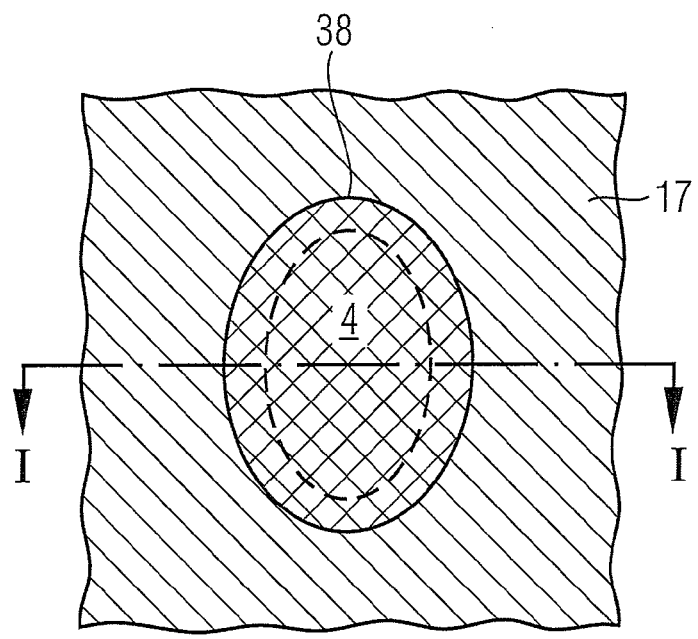
FIGS. 1A and 1B illustrate a plan view and a cross-sectional view of a trench capacitor, respectively, forming a starting point of one embodiment of the present invention.
Figure 1B:
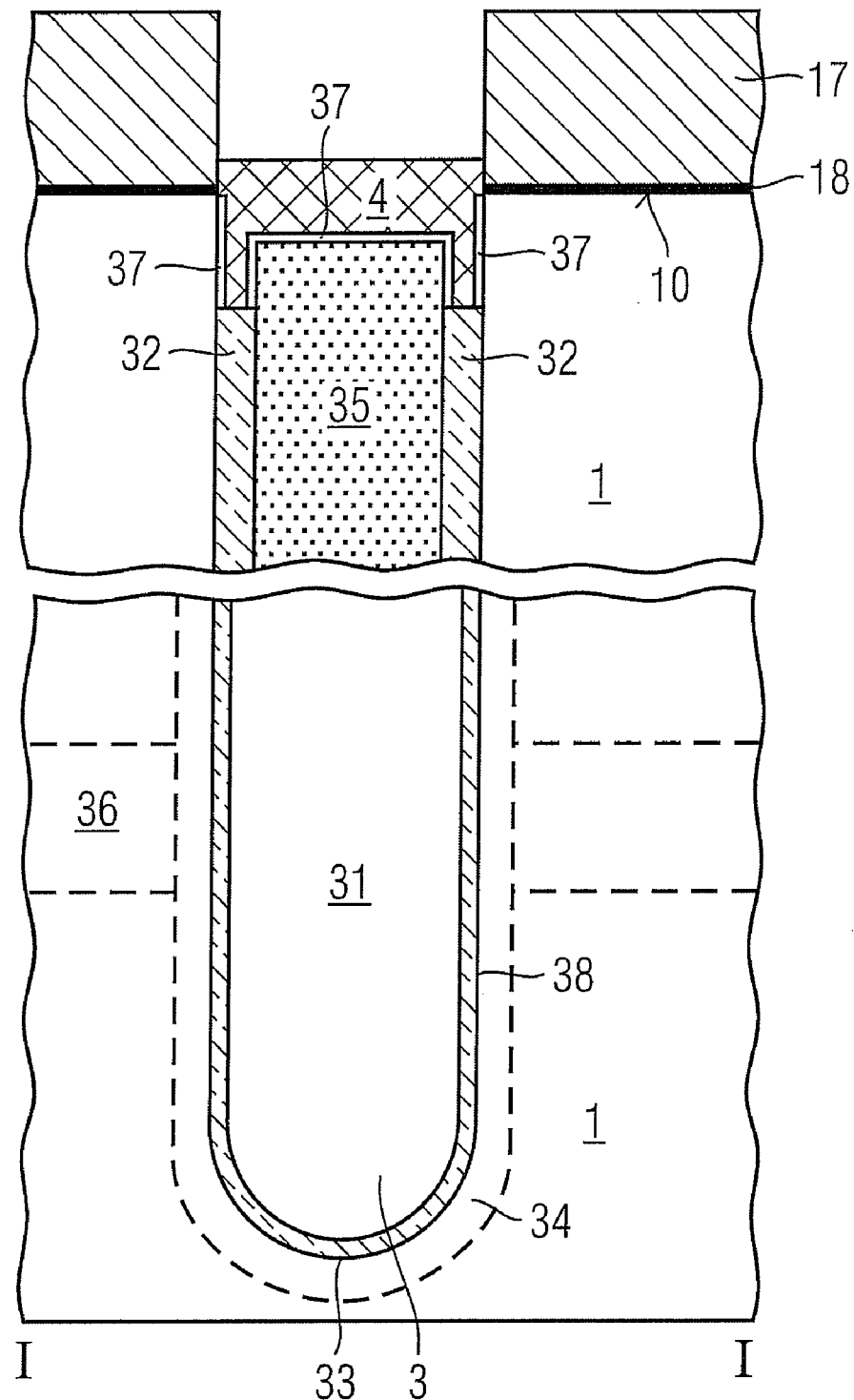

FIGS. 1A and 1B illustrate a plan view and a cross-sectional view, respectively, of a storage capacitor that is disposed in a capacitor trench 38, which is formed in a semiconductor substrate 1, in particular, a silicon substrate. The trench usually has a depth of 6 to 7 µm and can be formed in the manner which is illustrated in FIG. 1B in a cross-sectional view. Nevertheless, the capacitor trench 38 can as well be widened in its lower portion. The trench can have an arbitrary shape, in particular, a circular or an oval shape. The larger diameter of the capacitor trench is approximately 2 F, whereas the smaller diameter thereof is 1.5 F. In this respect, F denotes the minimal structural feature size which is obtainable by the lithographic method used. In particular, F can be 90 to 110 nm and in particular be less than 90 nm, for example, 70, 55 or 40 nm.

FIG. 1B is a cross-sectional view along the line I and I, as is illustrated in FIG. 1A. The storage capacitor includes a storage electrode 31, a storage dielectric 33 as well as a counter electrode 34. The counter electrode 34 of the storage capacitor can in particular be implemented as a n$^+$ doped substrate portion. The storage electrode usually is implemented as a polysilicon filling whereas the capacitor dielectric 33 can be any suitable dielectric such as $SiO_2$, $Si_3N_4$, RuO, HfO and others. An isolation collar 32 is disposed in the upper trench portion for avoiding the formation of a parasitic transistor, which would otherwise form at this position.

In the upper portion of the capacitor trench 38, a polysilicon filling 35 is provided. The substrate further includes an n-doped portion acting as a buried plate contact 36 that connects the counter electrodes of the trench capacitors with each other. A $SiO_2$ layer 18 as well as a $Si_3N_4$ layer 17 acting as a pad nitride layer are disposed on the surface 10 of the semiconductor substrate. The $SiO_2$ layer 18 typically has a thickness of approximately 4 nm, whereas the $Si_3N_4$ layer 17 typically has a thickness of 80 to 120 nm.

The trench capacitor illustrated in FIG. 1B is manufactured according to generally known methods. In particular, an isolation collar 32 is formed as is usual. Thereafter, the polysilicon filling 35 is etched to a target depth of 0 nm below the substrate surface 10 with a tolerance of ±15 nm. Then, the isolation collar 32 is etched by approximately 30 to 40 nm. In particular, the isolation collar 32 is etched back so that the upper surface of the polysilicon filling 35 is disposed below the substrate surface 10. Thereafter, a nitridation step as is generally known is performed. As a result, a thin $Si_3N_4$ layer 37 having a thickness of approximately 1 mm is formed on the surface of the polysilicon filling 35 and on the sidewalls of the silicon substrate. The nitridation step is performed, for example, by exposing the substrate surface to an $NH_3$ atmosphere. The $Si_3N_4$ layer 37 will act as an etch stopping layer when performing an etching step.

Thereafter, an n-doped amorphous silicon layer 4 is deposited and recessed, for example, by etching so that the surface of the amorphous silicon layer 4 finally has the same height as the surface 10 of the semiconductor substrate 1 or it lies up to 10 nm above the surface of the semiconductor substrate 1.

In the next steps, a contact strap between the polysilicon filling 35 and the substrate 1 will be provided. In particular, a contact having a low aspect ratio will be provided which means that only 50 nm depth of this strap cut is required. Stated differently, for providing the contact strap, a recess extending 50 nm below the substrate surface 10 is formed. The small depth of the strap cut is due to the fact that the contact strap is formed in the surface region of the device. In particular, the upper surface of the contact strap is disposed above the substrate surface whereas the lower surface of the contact strap is disposed below the substrate surface. The low aspect ratio of the contact further simplifies the manufacturing process.

For providing the contact strap, first, a nitridation step as has been described above is performed so as to provide a $Si_3N_4$ layer (not shown) having a thickness of 2 nm. Thereafter, an amorphous silicon layer (not shown) is deposited as a liner layer. Optionally, the amorphous silicon liner can be recessed. Thereafter, a tilted implantation step with $BF_2^+$ or $B^+$ ions is performed so as to provide doped and undoped portions. In particular, the ion beam 42 is irradiated with a predetermined tilt angle so that part of the $Si_3N_4$ layer 17, which is adjacent to the trench, acts as a shadowing mask. As a consequence, the portions of the amorphous silicon layer which are adjacent to this part of the $Si_3N_4$ layer 17 are not doped, whereas the remaining portions of the amorphous silicon layer are doped.

Figure 2:
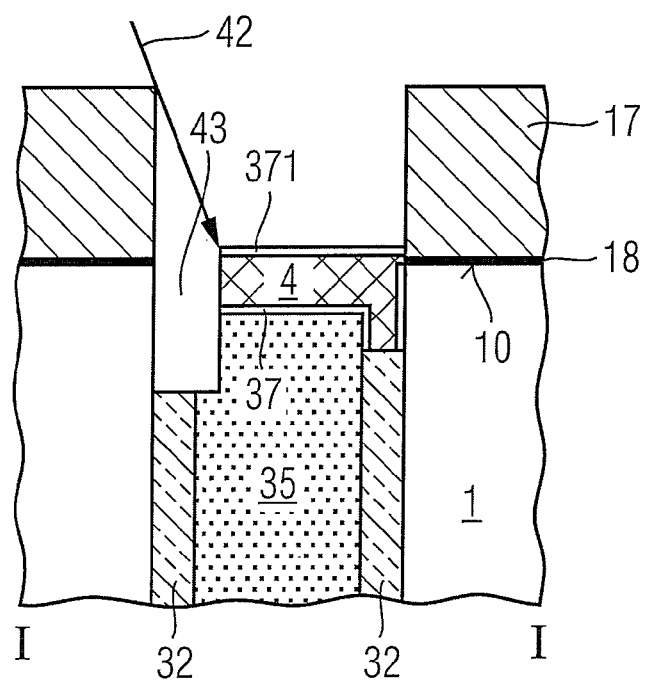

In the next step, the undoped amorphous polysilicon is removed by wet etching. Then, the B-doped amorphous silicon material is oxidized so as to form an $SiO_2$ layer (not shown). Taking this $SiO_2$ layer as an etching mask, etching steps for etching the uncovered portions of the $Si_3N_4$ layers 371, 37 as well as the polysilicon material 4, 35 are performed. Finally, the $SiO_2$ layer is removed by an etching step which also etches the uncovered upper portion of the isolation collar 32. Thereafter, an etching step is performed as to provide the opening 43. The resulting structure is illustrated in FIG. 2.

Figure 3A:
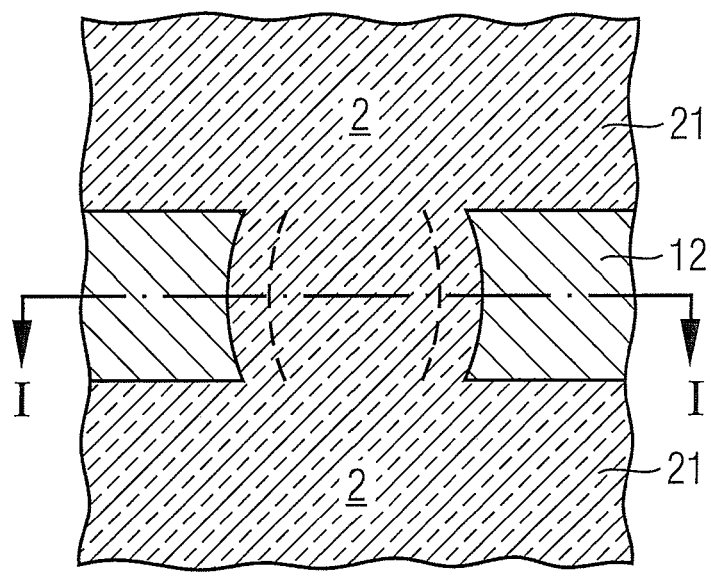
Figure 3B:
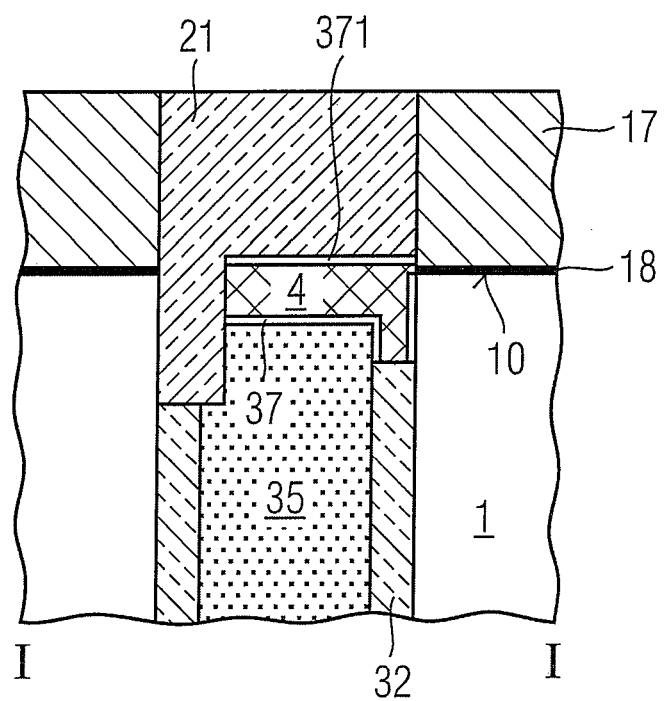

In the next step, the shallow trench isolation process is performed as is usual. Thereby, isolation trenches 2 are defined, the isolation trenches extending parallel with respect to the active areas 12. In particular, in the cross-sectional view illustrated in FIG. 3B, the isolation trenches 2 extend before or behind the illustrated cross-section. Thereafter, the isolation trenches as well as the upper portion of the capacitor trench are filled with a $SiO_2$ filling 21. The resulting structure is illustrated in FIG. 3, wherein FIG. 3A illustrates a plan view and FIG. 3B illustrates a cross-sectional view.

Figure 4A:
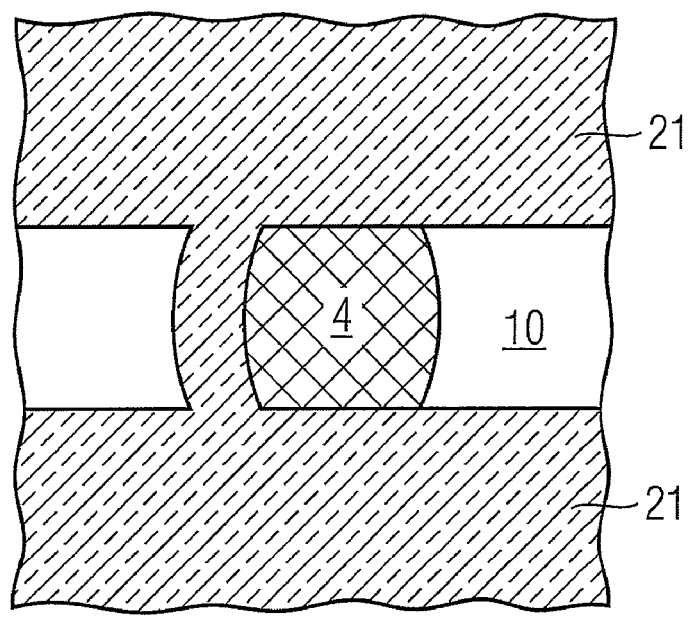
Figure 4B:
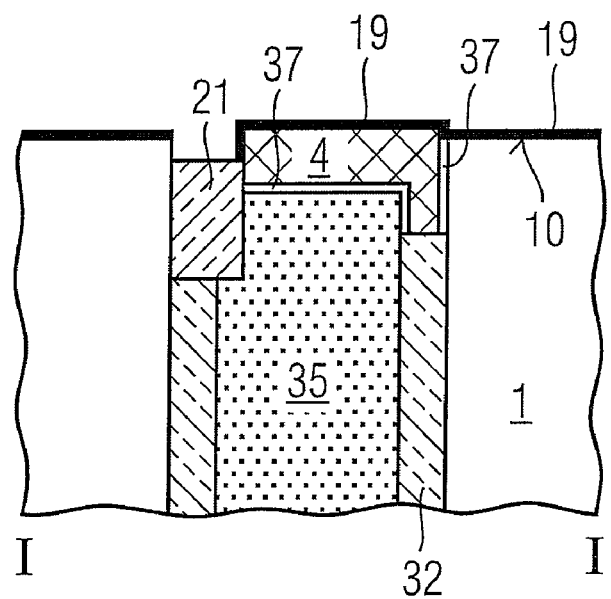

Thereafter a deglazing step is performed so as to remove superficial $SiO_2$ from the surface. In particular, this step is performed so as to remove the $SiO_2$ filling 21 from the surface of the silicon nitride layer 371. Thereafter, the silicon nitride layers 17, 371 are removed by etching, followed by an etching step for etching the silicon dioxide layer 18. As a result, the substrate surface as well as the surface of the amorphous silicon filling 4 are uncovered, whereas $SiO_2$ material 21 is disposed in the gap between the silicon substrate 1 and the polysilicon filling 35. FIG. 4A illustrates a plan view of the resulting structure after removing the $SiO_2$ layer 18. In the next step, an oxidation step for providing an $SiO_2$ layer 19 is performed. As a consequence, as can be seen from FIG. 4B, the whole surface now is covered with a thin $SiO_2$ layer 19.

Figure 5:
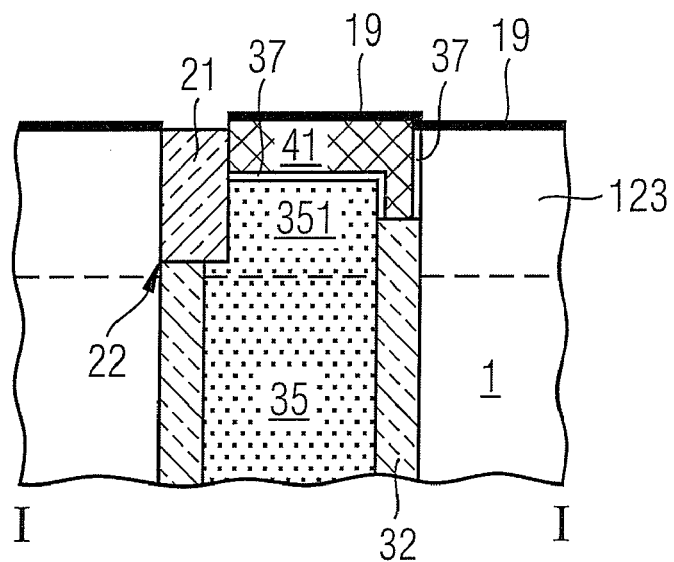

In the next step, a mask is provided so as to cover the peripheral portions. Thereafter, implantation steps are performed so as to provide the usual doped well regions as well as the doped region 123 for providing the first and second source/drain regions. In particular, when providing the doped portion 123, the vertical junction depth between undoped silicon substrate material 1 and the doped portion 123 is adjusted so as to cover the shallow buried strap portion. In particular, the doped portion 123 extends to a depth of approximately 50 to 60 nm which is equal to or slightly larger than the lower edge 22 of the $SiO_2$ filling 21. In addition, by this implantation step, also the upper portion of the polysilicon filling 35 is doped so as to form the doped polysilicon filling 351. Moreover, by this implantation step, also the amorphous silicon layer is doped resulting in the doped amorphous silicon layer 41. Due to this doping, the contact resistance is further reduced. The resulting structure is illustrated in FIG. 5.

After removing the mask which covers the peripheral portion, an $SiO_2$ layer 47 having a thickness of approximately 0.5 F is deposited. The thickness of this liner is adjusted so as to pattern the inner spacer and for providing a top isolation of the trench capacitor 3.

Figure 6A:
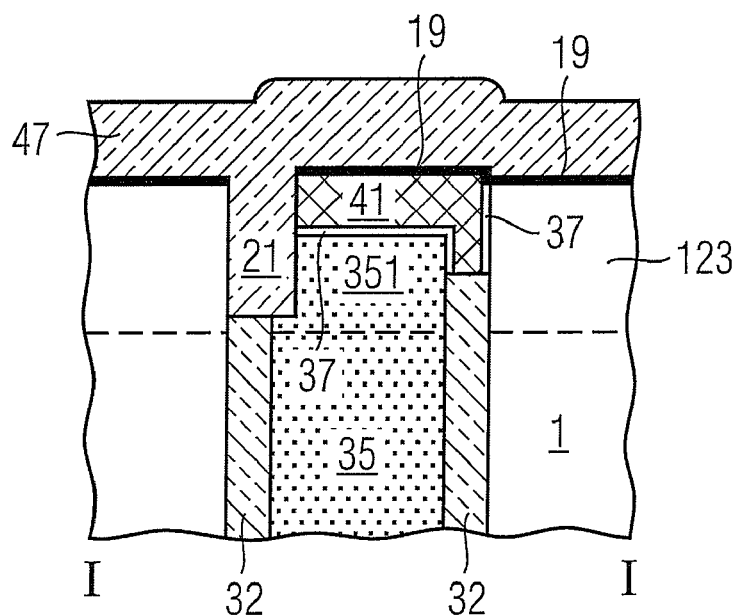
Figure 6B:
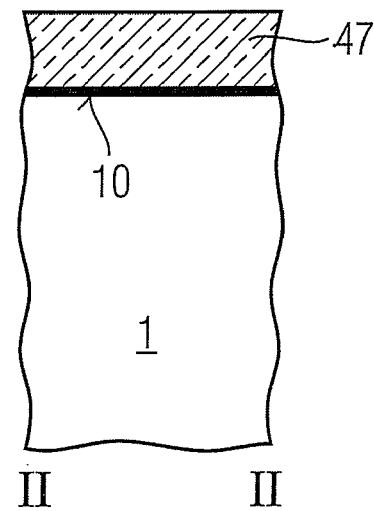
Figure 10A:
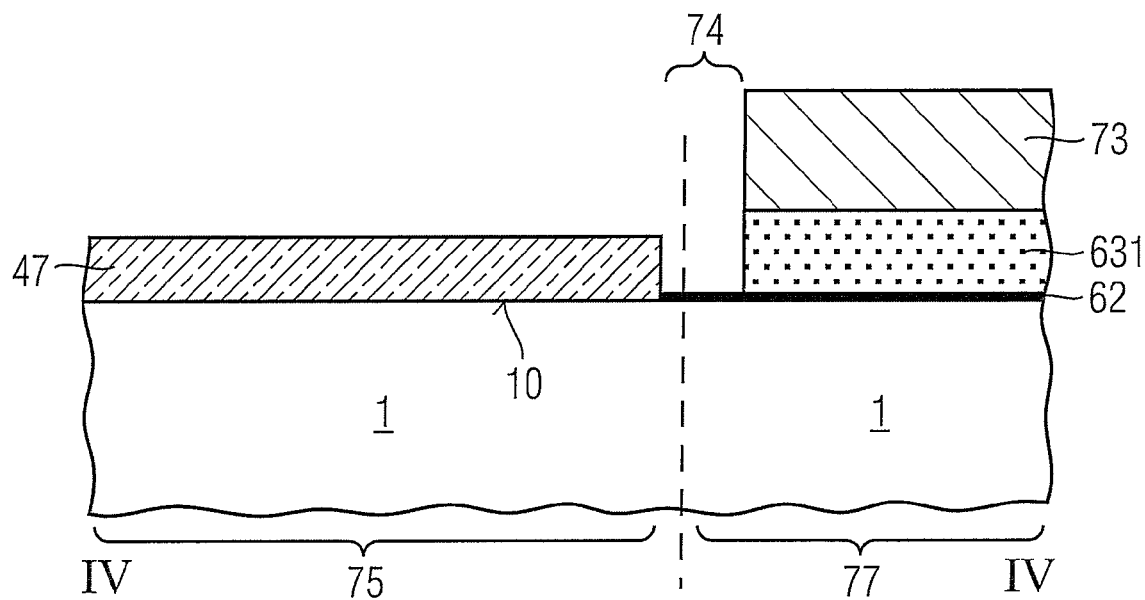
Figure 10B:
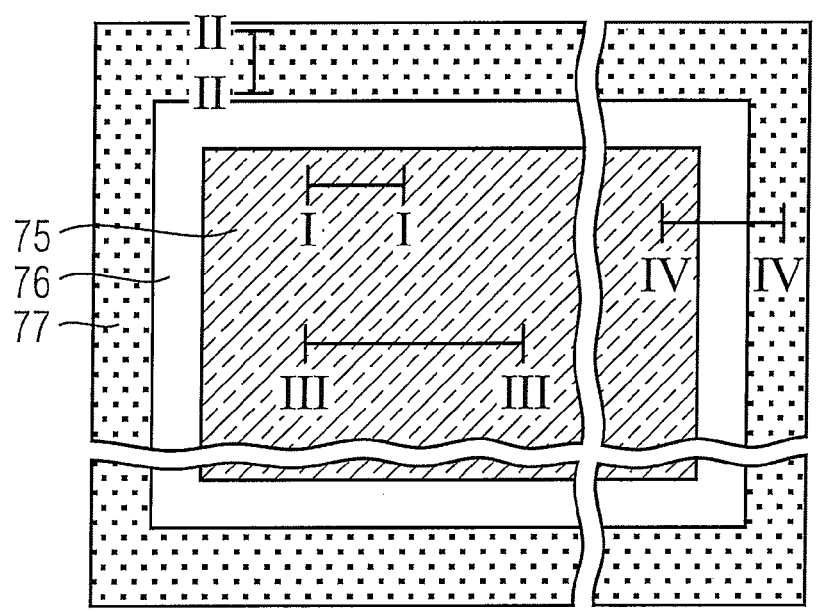

In particular, the $SiO_2$ layer 47 will act as a trench top oxide in the completed memory cell array. The cross-sectional view of the resulting array portion is illustrated in FIG. 6A. Moreover, FIG. 6B illustrates a cross-sectional view between II and II as can be taken from FIG. 10B, illustrating the peripheral portion.

Thereafter, the steps for forming the transistor of the present invention will be performed. In particular, a gate groove 150 is defined in the surface 10 of the semiconductor substrate 1. After etching the gate groove 150, a widening step, in particular, a chemical down stream etch widening step is performed so as to increase the diameter of the gate groove. Thereafter, in the array portion only, the gate oxide 151 is defined on the surface of the gate groove 150. Thereafter, the gate groove 150 is filled with polysilicon material 156 which is in situ doped with P ions. Thereafter, a maskless polysilicon-recessing step is performed by etching the polysilicon selectively with respect to the silicon dioxide material on the surface 10. Thereby, the support portion is cleaned off remaining polysilicon material and the polysilicon filling 156 of the gate groove 150 is recessed.

Figure 7:
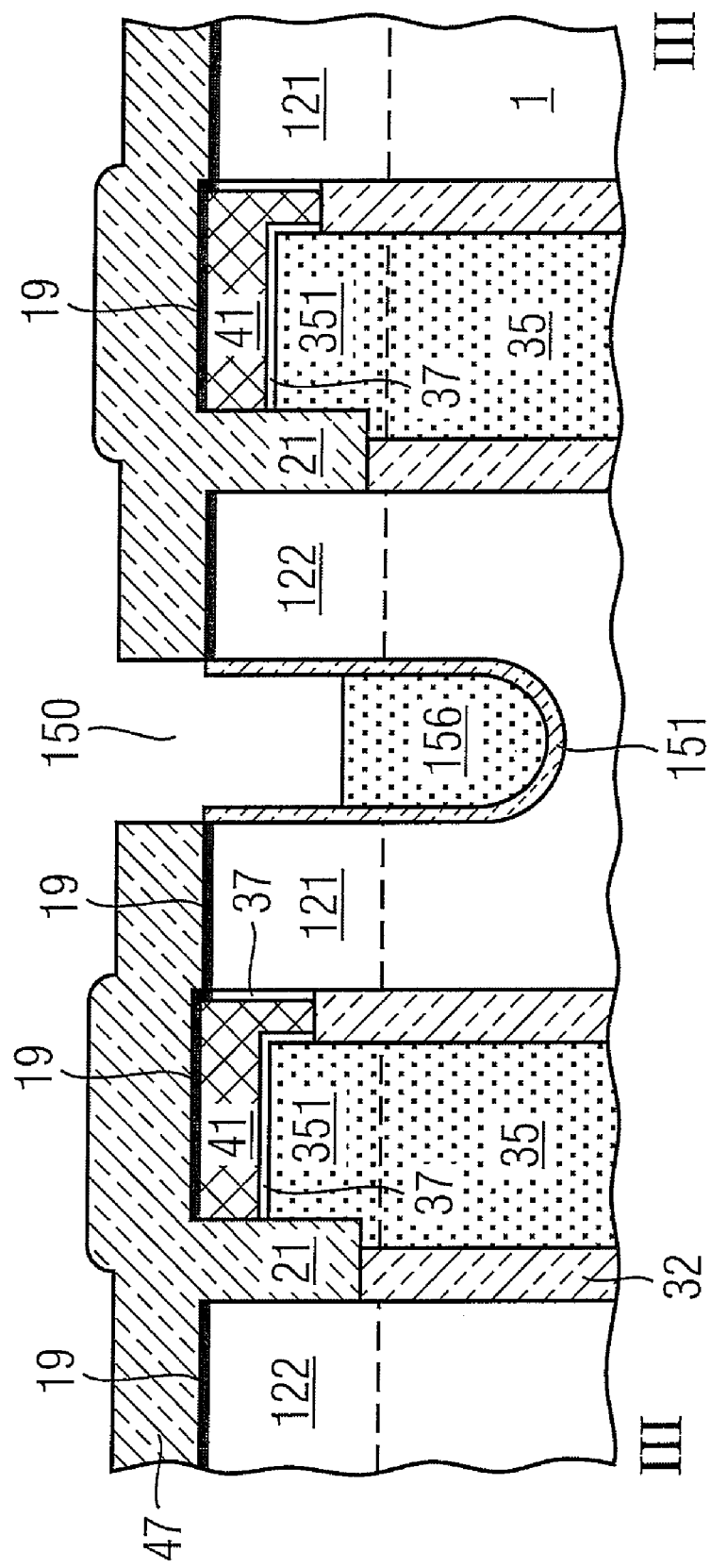

The resulting cross-sectional view is illustrated in FIG. 7, which is a view across more than one memory cell. In particular, the view of FIG. 7 is taken between III and III as can be seen from FIG. 10B, for example. In particular, as can be seen from FIG. 7, the upper surface of the polysilicon filling 156 is below the surface 10 of the semiconductor substrate 1 and above the junction of the doped/undoped substrate portion. As a modification of the process steps, optionally, a short wet etching step for etching $SiO_2$ material can be performed before the step of forming the gate oxide, so as to form divots in the isolation trenches 2 at a position adjacent to the gate groove. According to this modification, the divots are formed in a cross-section before and behind the illustrated cross-section. Accordingly, the gate electrode 15 will enclose the channel at three sides thereof in a cross sectional view along the direction which is defined by a line connecting the first and second source/drain regions. In this case, the channel has the shape of a ridge, the channel being enclosed by the gate electrode 15 at at least three sides thereof. Depending from the depth d to which each of the divots extends and, in addition, from the width w of the active area, the resulting transistor is either referred to an "EUD" ("extended u-groove device") or a Fin-FET. In particular, if d≦w/2, the resulting width of the gated channel is increased and the transistor is referred to as an "EUD". Such a transistor exhibits improved properties. In particular, an "EUD" has a reduced leakage current while showing an improved on-current performance. In summary, an "EUD" has an optimized sub-threshold slope. In contrast, if d>w/2, the channel of the resulting transistor can be fully depleted, and the transistor is referred to as a Fin-FET.

Thereafter, optionally, a sidewall oxidation step can be performed whereby etch damages can be annealed and the silicon oxide in the junction region between the doped/undoped substrate material can be enhanced. Thereafter, a silicon dioxide spacer 154 is deposited as a conformal layer in the gate groove 150. In particular, a final thickness of the spacer 154 of 10 to 20 nm is achieved. FIG. 8A illustrates a cross-sectional view of the resulting structure. As can be seen, the surface of the gate groove 150 now is covered with a SiO$_2$ layer 154. Moreover, FIG. 8B illustrates a schematic cross-sectional view of the junction between the array and the peripheral portion between IV and IV as can be taken from FIG. 10B, for example. As can be seen from FIG. 8B, the array portion as well as the support portion are covered with a SiO$_2$ layer 47.

In the next step, the array portion is covered with a mask 72, leaving the peripheral portion 77 uncovered. This is illustrated in FIG. 9A.

In the next step, the sacrificial SiO$_2$ layer 62 is provided on the resulting surface in the peripheral portion 77. In addition, the usual well implants are performed so as to provide the peripheral doped portion 61 in the peripheral portion. Thereafter, the mask 72 is removed from the array portion. Then, an undoped polysilicon layer is deposited on the whole substrate surface.

The resulting structure is illustrated in FIGS. 9B and 9C. In particular, as can be seen from FIG. 9B illustrating a cross-sectional view of the array portion between III and III, the polysilicon layer 71 is deposited in the array portion. In addition, as can be seen from FIG. 9C illustrating a cross-sectional view of the peripheral portion 77. On the surface 10 of the substrate 1, the peripheral SiO$_2$ layer 62 is formed, being covered by the polysilicon layer 63.

Thereafter, further implantation steps are performed in the peripheral portion. In particular, the polysilicon layer 63 is n- and p-doped so as to provide a gate electrode for n-FETs and p-FETs. These implantation steps are performed using suitable masks for covering the portions which are not to be doped. Thereafter an annealing step is performed so as to obtain a re-crystallized portion in the peripheral portion. Thereafter, the mask 73 is provided in the peripheral portion, leaving the array portion uncovered. In particular, FIG. 10A illustrates the regions which are now covered with a mask 73. As can be seen, in the array portion 75, no mask 73 is provided, a space 74 being formed due to mask overlap between the array portion 75 and the peripheral portion 77.

FIG. 10B illustrates a plan view on the substrate surface, showing the array portion 75, the peripheral portion 77 as well as the border portion 76 which is formed between the array portion and the peripheral portion 77. FIG. 10B also illustrates the positions at which the various cross-sectional views are taken.

After covering the peripheral portion with the mask 73, the polysilicon layer 71 is recessed in the array portion, this etching step stopping on the silicon dioxide layer 47 and the SiO$_2$ spacer 154. The resulting structure is illustrated in FIG. 11A. In particular, as can be seen from FIG. 11A, in the array portion now the SiO$_2$ layer 47 is unexposed. A cross-sectional view of the resulting structure in the peripheral portion is illustrated in FIG. 11B. As can be seen from FIG. 11B, now a doped polysilicon layer 631 is disposed on the surface of the silicon dioxide layer 62.

In the next steps, first, the horizontal portions of the SiO$_2$ spacer 154 will be removed from the surface of the polysilicon filling 156 of the gate groove, and, thereafter, the layer stack for defining the upper portion of the gate electrode will be deposited. To this end, first, a selective etching step which etches SiO$_2$ selectively with respect to polysilicon material is performed so as to open the surface of the polysilicon filling 156 in the gate groove. This step can be performed as a separate etching step or it can be performed in combination with an in-situ sputter pre-cleaning step. For example, such a sputtering step can be performed with Ar$^+$ ions in order to clean the surface of the substrate surface. Thereby, about 5 nm material are etched. Then, the layer stack including at least one metal or metal compound layer is formed. First, a Ti layer is deposited by a PVD method, the Ti layer 561 having a thickness of 2 to 5 nm in the horizontal portions and not being deposited on the sidewalls of the gate groove. Thereafter, a TiN layer 562 is deposited by a PVD method so as to obtain a thickness of 5 nm in the horizontal portions, no TiN being deposited on the sidewalls of the gate groove. Thereafter, a second part of the TiN layer 562 is deposited by a CVD method so as to obtain a conformally deposited layer having a thickness of 10 nm on the horizontal portions as well as on the vertical portions of the surface. The TiN layer is deposited in order to reduce a contact resistance between the polysilicon layer 156 and the conductive layers above. Finally, a WN/W layer stack 563 is deposited by a PVD method, the WN/W layer stack having a thickness in the horizontal portions of 40 nm and a thickness on the sidewalls of the groove of less than 10 nm. Finally, a gate stack annealing step will be performed.

By the step of depositing the WN/W layer stack 563, the gate groove 150 will not entirely be filled. In particular, a void 57 is formed. The electrical contact between the WN/W layer stack 563 and the polysilicon filling 156 will be assured by the Ti/TiN stack and, in particular, the conformal deposition step of depositing TiN by a CVD method. As a result, the gate stack now is completed. The resulting structure is illustrated in FIG. 12.

As can be seen from FIG. 12A, illustrating a cross-sectional view between III and III of the array portion, the complete surface now is covered with the WN/W layer stack 563. The gate groove 150 is filled with a conductive material, so that the conductive material, in particular, the metal layers 561, 562 and 563 extend to below the substrate surface 10.

In the support portion between II and II, as can be seen from the cross-sectional view depicted in FIG. 12B, the same layer stack is formed.

Thereafter, as is illustrated in FIG. 13, a cap nitride (Si$_3$N$_4$) layer 58 is deposited by generally known methods. As a consequence, a Si$_3$N$_4$ layer 58 is formed on the surface of the tungsten layer 563, as is illustrated in FIG. 13, wherein FIG. 13A illustrates a cross-sectional view between III and II of the array portion and FIG. 13B illustrates a cross-sectional view between II and II in the peripheral portion.

In the next steps, photolithographic process steps will be performed so as to pattern the deposited gate stack in order to form word lines 51 and gate electrodes 78. In particular, in the peripheral portion, the layer stack is patterned by etching down to the gate oxide 62 in the peripheral portion, whereas in the array portion the etching step is performed down to the surface of the $SiO_2$ layer 47. Thereafter, optionally, an offset spacer for the peripheral portion can be formed or a thermal oxidation step with annealing can be performed. Thereafter, a silicon nitride spacer 59 is formed in the array portion as well as in the peripheral portion by a generally known method. To be more specific, first, a $Si_3N_4$ layer is conformally deposited, followed by an anisotropic etching step for etching the horizontal portions of the $Si_3N_4$ layer. The etching step of etching the horizontal portions of the deposited silicon nitride layer is performed so as to stop on the surface of the silicon oxide liner 47 and the gate oxide layer 62 in the peripheral portion.

As an alternative, a silicon dioxide spacer can be provided. In this case, the word lines 51 are patterned as has been described above. After patterning the word lines in the array portion, the silicon dioxide liner is further etched selectively with respect to Si. Thereafter, a thin silicon nitride liner encapsulating the word lines 51 is formed, followed by a step of depositing a silicon dioxide spacer layer. When forming the word lines, the step of patterning the gate stack can be optimized for the peripheral portion, since in the array portion no polysilicon layer is to be etched. In particular, the parameters of the etching process of the polysilicon layer can be selected so as to obtain a desired profile in the peripheral portion while the array portion is not affected, since in the array portion the polysilicon layer disposed in the lower portion of the gate groove.

Figure 14A:
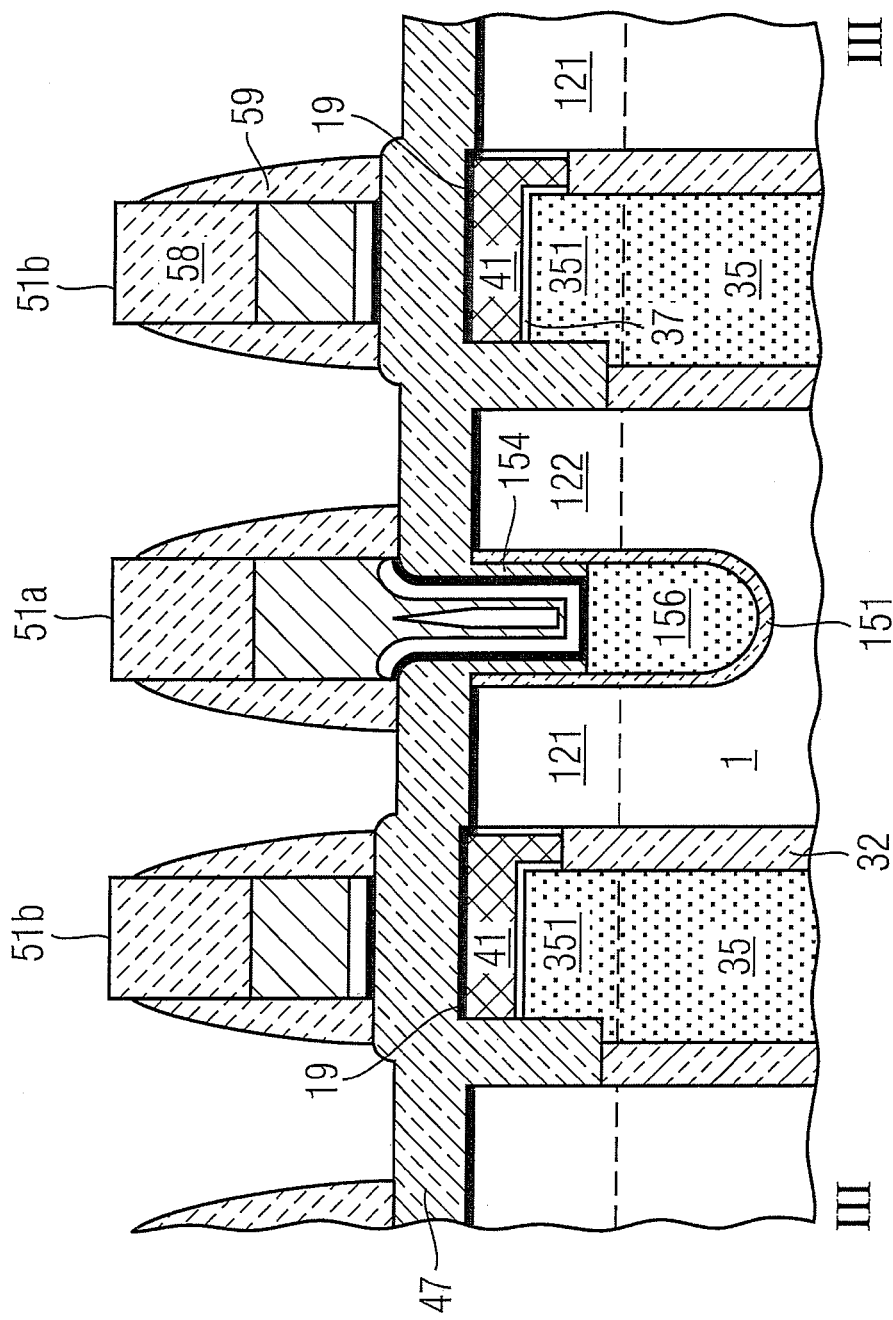
Figure 14B:
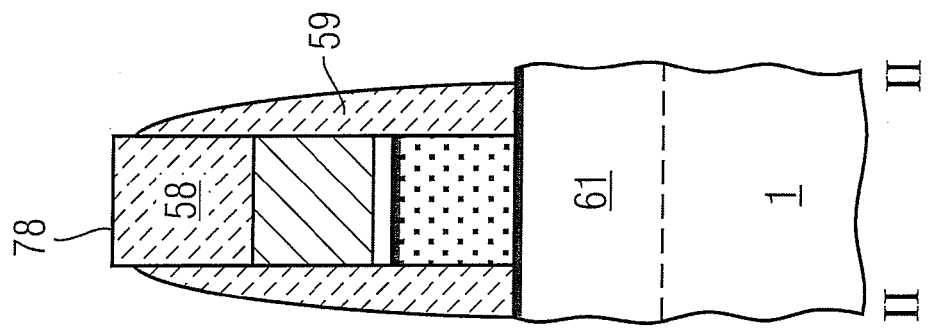

The resulting structure is illustrated in FIG. 14. In particular, FIG. 14A illustrates a cross-sectional view of the array portion between III and III, whereas FIG. 14B illustrates a cross-sectional view between II and II in the peripheral portion. In particular, as can be seen from FIG. 14A, active word lines 51a and passing word lines 51b are formed in the array portion. As can further be seen, the upper portion of the gate electrode is formed of a metal layer stack. In the peripheral portion, as is illustrated in FIG. 14B, the gate electrode 78 likewise comprises a lower portion made of a polysilicon layer 631 as well as an upper portion which is made of a metal layer stack. The polysilicon layer 631 is adjacent to the gate oxide layer which in turn is adjacent to the substrate surface, and, in particular, the doped portion 61. In the array portion, the metal layer stack is insulated from the first and second source/drain regions 121, 122, by the gate oxide layer 151, and, in addition, the silicon dioxide spacer 154. In particular, the silicon dioxide spacer 154 extends to the same depth as the metal layer stack of the gate electrode.

In the next steps, the generally known LocHiS process will be performed in order to provide the bit line contacts in the array portion, while the peripheral portion is not effected. To this end, first, sacrificial polysilicon plugs 551 are formed in the array portions at those positions at which the bit line contacts are to be formed. The resulting structure is illustrated in FIG. 15, wherein FIG. 15A illustrates a cross-sectional view between III and III in the array portion and FIG. 15B illustrates a cross-sectional view between II and II in the peripheral portion. As can be seen from FIG. 15A, the sacrificial polysilicon plugs 551 are formed at the positions at which the bit line contacts are to be formed so as to be directly in contact with the silicon dioxide layer 47, whereas, as can be seen from FIG. 15B, the peripheral portion is not effected.

After depositing a BPSG layer and performing a CMP (chemical mechanical polishing) step, the spaces between the polysilicon plugs 551 are filled with BPSG material 55. Thereafter, the sacrificial polysilicon plugs 551 are removed so as to form openings 552. After etching the sacrificial polysilicon plugs an etching step which etches the silicon dioxide liner 47 selectively with respect to silicon nitride and to silicon is performed so as to extend the openings 552 so as to be in contact with the second source/drain regions 122.

The resulting structure is illustrated in FIG. 16, wherein FIG. 16A illustrates a cross-sectional view between III and III of the array portion and FIG. 16B illustrates a cross-sectional view between II and II of the peripheral portion. As can be seen from FIG. 16A, now openings 552 are formed in the BPSG layer, the openings 552 extending to the surface of the second source/drain regions 122. In addition, as can be seen from FIG. 16B, the peripheral portion is covered with a BPSG layer 55.

Figure 17:
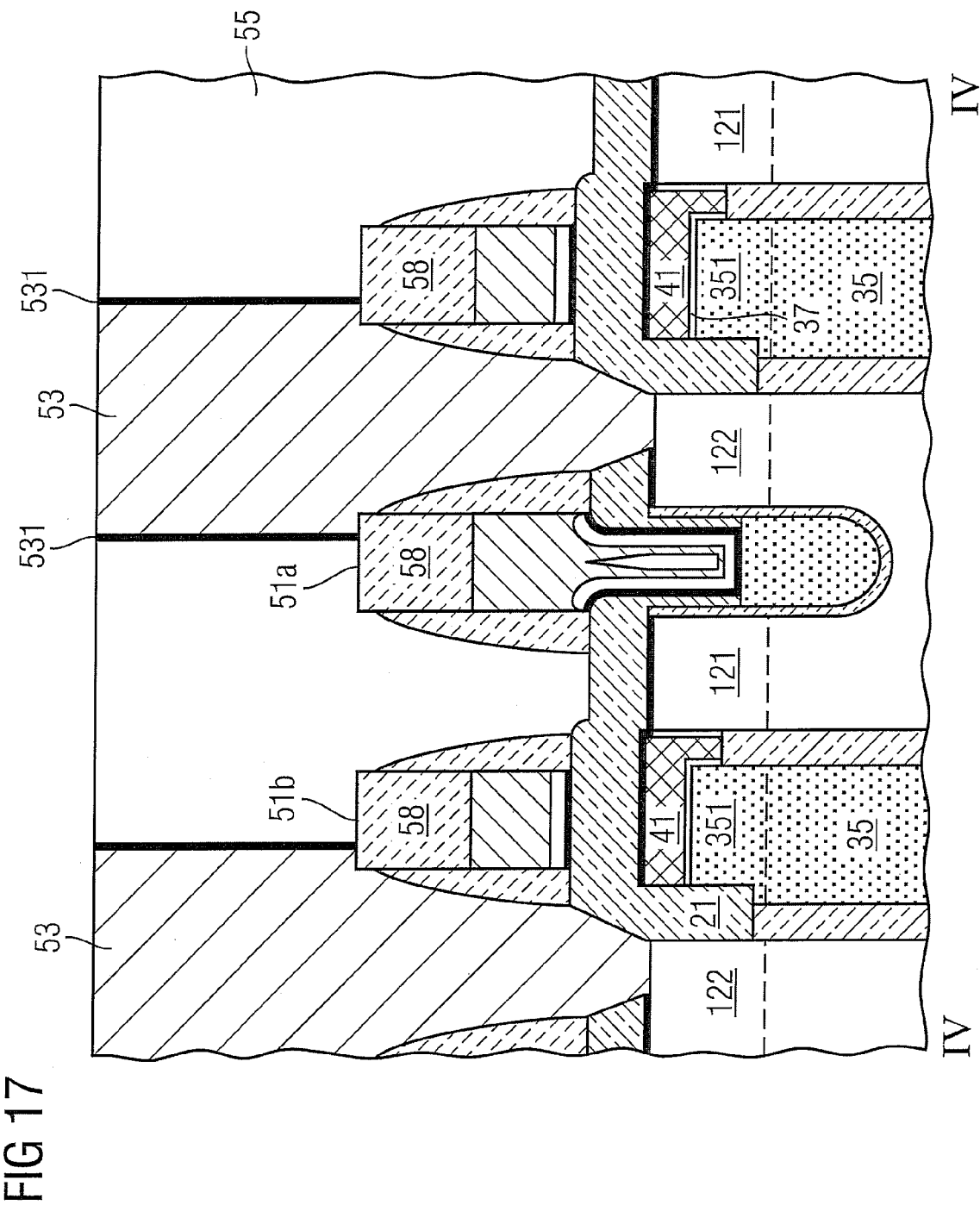

In the next step, first, a TiN liner 531 is deposited, followed by a tungsten layer. After a CMP step, the tungsten plugs 53 are formed. The resulting structure is illustrated in FIG. 17 illustrating a cross-sectional view of the array portion. As can be seen from FIG. 17, tungsten plugs 53 are in contact with the second source/drain regions 122.

In the next step, the bit lines 52 are formed on the resulting surface, as is common. In particular a tungsten layer is deposited and patterned so as to form individual bit lines 52. In particular, the bit lines 52 extend perpendicularly with respect to the word lines 51. The resulting structure is illustrated in FIG. 18.

Figure 18:
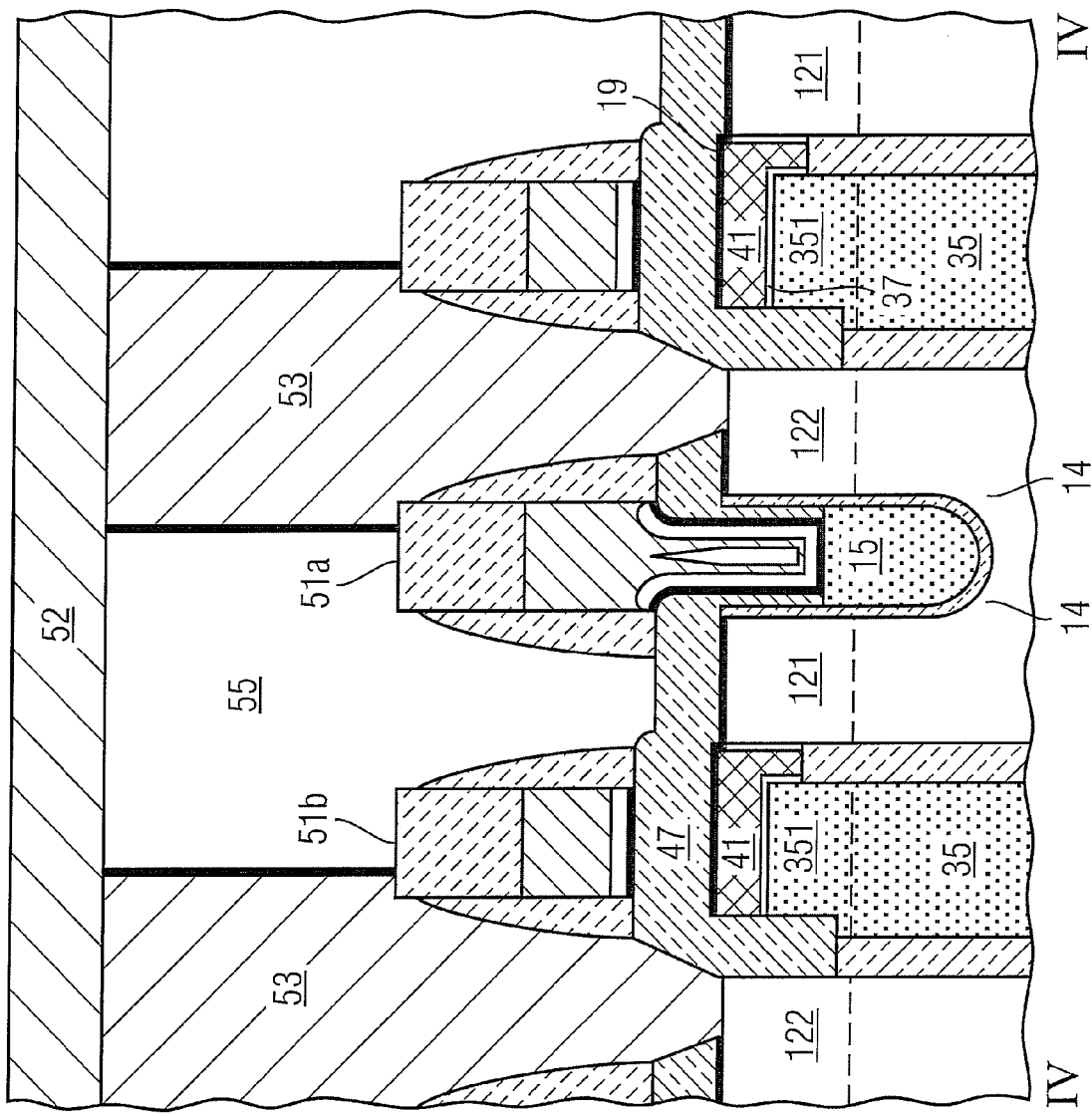
FIG. 18 illustrates a cross-sectional view of a completed memory cell array according to one embodiment of the present invention.

In particular, as is illustrated in FIG. 18, a transistor is formed, including a first and a second source/drain regions 121, 122. The first and the second source/drain regions 121, 122 are adjacent to the substrate surface 10. The conductivity of the channel 14 connecting the first and the second source/drain regions 121, 122 is controlled by the gate electrode 15 which is disposed in a gate groove 150. The gate electrode is insulated from the channel by a gate isolating layer 151. Since the gate electrode 15 is disposed in the groove, a current path has horizontal as well as vertical components with respect to the substrate surface. The gate electrode 15 includes a lower portion which is made of a polysilicon material and an upper portion which comprises at least one metal layer or at least one metal compound layer. The upper portion of the gate groove is adjacent to the lower portion of the gate groove. Accordingly, the contact resistance between the lower portion of the gate electrode and the upper portion thereof is greatly reduced.

An $SiO_2$ spacer 154 is provided between the upper portion of the gate electrode and the gate oxide layer 151. The $SiO_2$ spacer 154 has a larger thickness than the gate isolating layer 151. When addressing a certain gate electrode by activating the corresponding active word line 51a, the channel 14 between the first and second source/drain region becomes conductive and reads out an information which is stored in a storage capacitor. In particular, the electrical charge stored in the capacitor is read out via the doped polysilicon portion 351, the doped amorphous silicon portion 41 and the first source/drain region 121. The electrical charge is transferred via the second source/drain region to the corresponding bit line 52 via the bit line contact 53 which is disposed between the second source/drain region and the bit line 52.

The upper portion of the gate electrode 15 includes at least one metal layer. In particular, the metal layers of the upper portion of the gate electrode comprise at least one layer which is conformally deposited so as to cover the sidewalls of the gate groove. The metal layers extend to a depth below the substrate surface 10 and they are electrically isolated from the adjacent first and second source/drain regions 121, 122 by the silicon dioxide spacer 154.

Figure 19:
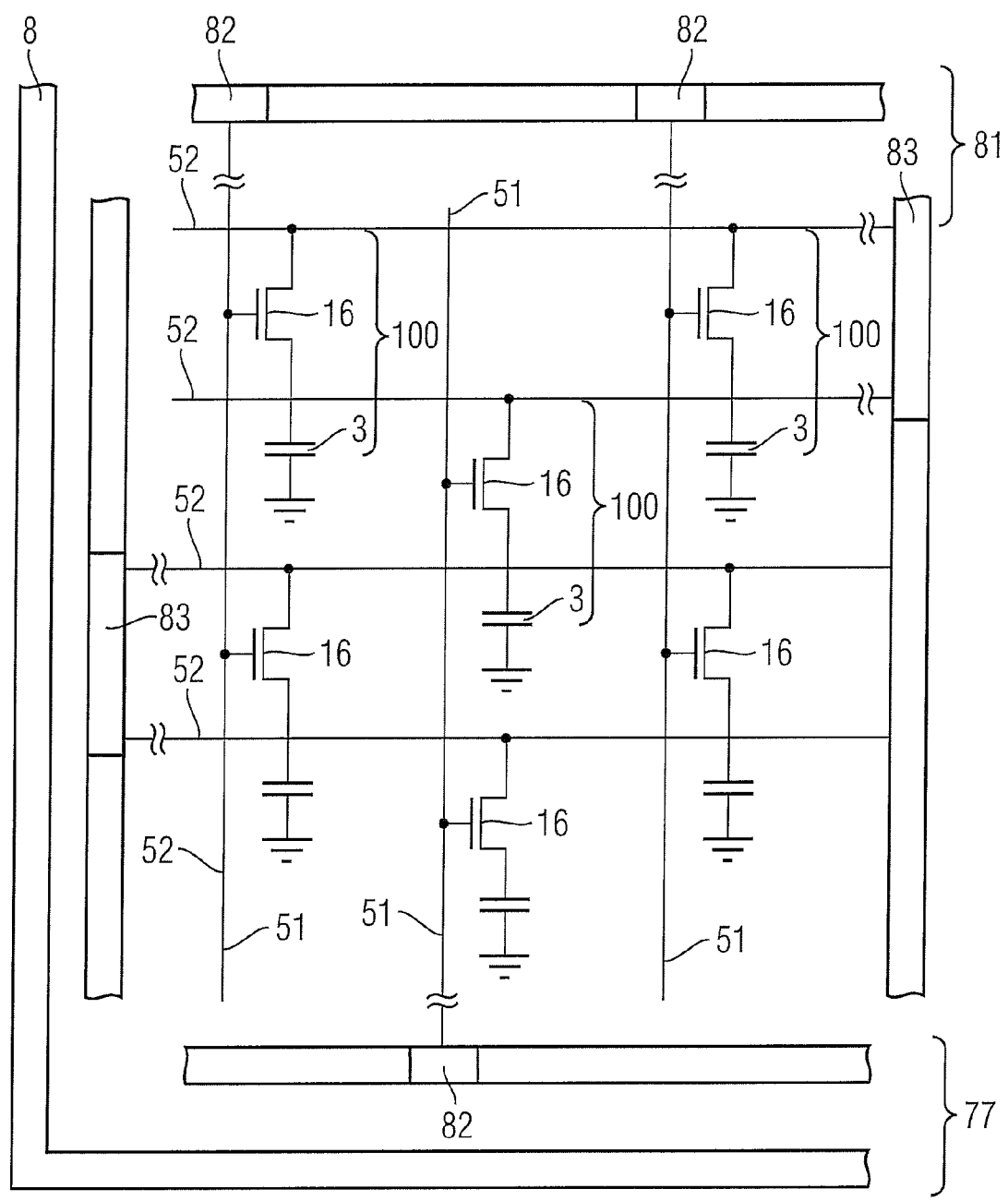
FIG. 19 illustrates a schematic plan view on a memory device having the memory cell array of one embodiment of the present invention.

FIG. 19 illustrates a schematic plan view of an exemplary memory device comprising a memory cell array 75 as well as the peripheral portion 77. To be more specific, the peripheral portion 77 includes the support circuitry 8 as well as the core circuitry 81 in which, in particular, the word line drivers 82 and the sense amplifiers 83 are disposed. Usually, the word lines 51 as well as the bit lines 52 are arranged so as to perpendicularly intersect each other. A memory cell 100 comprises a storage capacitor 3 comprising a storage electrode 31 and a counter electrode 34 as well as a capacitor dielectric which is disposed between the storage electrode and the counter electrode. The storage electrode is connected with the first source/drain region 121 of the transistor 16. By activating a transistor 16 via the corresponding word line 51, the electrical charge stored in the storage capacitor 3 is read out and transmitted to the corresponding bit line 52.

As is illustrated in FIG. 19 the sense amplifier 83 is arranged so as to read out the signals of an addressed memory cell 100 as well as of a memory cell 100 in a non-addressed state.

Then, the sense amplifier 83 compares the signals of these two memory cells. Nevertheless as is to be clearly understood, the present invention is applicable to any kind of memory cell architecture.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit including a transistor comprising:
a channel region disposed in a semiconductor substrate between a first and a second source/drain region, wherein the first and the second source/drain region are formed adjacent to an upper surface of the semiconductor substrate and wherein the channel region has horizontal and vertical components with respect to the upper surface of the semiconductor substrate;
a gate groove formed in the upper surface of the semiconductor substrate adjacent to the channel region, the gate groove comprising an upper portion and a lower portion, the upper portion being adjacent to the lower portion; and
sidewall spacers made of an insulating material,
wherein the lower portion of the gate groove is filled with polysilicon and a metal or a metal compound is disposed in the upper portion of the gate groove, thereby forming a gate electrode;
wherein an entire interface between polysilicon of the lower portion of the gate groove and the metal or metal compound is disposed below the upper surface of the semiconductor substrate; and
wherein the sidewall spacers are disposed on the sidewalls of the upper portion of the gate groove, a bottom side of the sidewall spacers being disposed above an upper side of the lower portion of the gate groove.

2. The integrated circuit of claim 1, wherein a bottom side of the sidewall spacers is at the same height as the interface between the lower portion of the gate groove and the metal or metal compound.

3. The integrated circuit of claim 1, wherein the channel region comprises a fin-region in which the channel region has the shape of a ridge, the ridge comprising a top side and two lateral sides in a cross section perpendicular to a channel direction being defined by a line connecting the first and the second source/drain regions, wherein the top side is disposed beneath the upper surface of the semiconductor substrate and wherein in a cross section perpendicular to the channel direction the gate electrode is disposed along the top side and the two lateral sides of the channel region.

4. The integrated circuit of claim 1, wherein a portion of the metal or metal compound is disposed above the upper surface of the substrate.

5. An integrated circuit including a transistor comprising:
a channel region disposed in a semiconductor substrate between a first and a second source/drain region, wherein the first and the second source/drain region are formed adjacent to an upper surface of the semiconductor substrate and wherein the channel region has horizontal and vertical components with respect to the upper surface of the semiconductor substrate; and
a gate groove formed in the upper surface of the semiconductor substrate adjacent to the channel region, the gate groove comprising an upper portion and a lower portion, the upper portion being adjacent to the lower portion;
wherein the lower portion of the gate groove is filled with polysilicon and a metal or a metal compound is disposed in the upper portion of the gate groove, thereby forming a gate electrode;
wherein an entire interface between polysilicon of the lower portion of the gate groove and the metal or metal compound is disposed below the upper surface of the semiconductor substrate; and
wherein a distance between a bottom side of the gate groove to the upper surface of the substrate is larger than a distance between a bottom side of the first and second source/drain regions and the upper surface of the substrate, respectively.

6. The integrated circuit of claim 5, wherein the channel region comprises a horizontal component.

7. The integrated circuit of claim 5, wherein the gate electrode is electrically connected to a metal conductive line by a layer stack comprising a metal layer.

8. The integrated circuit of claim 5, wherein a portion of the metal or metal compound is disposed above the upper surface of the substrate.

9. The integrate circuit of claim 5, wherein the channel region comprises a fin-region in which the channel region has the shape of a ridge, the ridge comprising a top side and two lateral sides in a cross section perpendicular to a channel direction being defined by a line connecting the first and the second source/drain regions, wherein the top side is disposed beneath the upper surface of the semiconductor substrate and wherein in a cross section perpendicular to the channel direction the gate electrode is disposed along the top side and the two lateral sides of the channel region.

10. The integrated circuit of claim 9, further comprising sidewall spacers made of an insulating material and being formed on sidewalls of the gate groove.

11. The integrated circuit of claim 10, wherein the sidewall spacers are disposed on the sidewalls of the upper portion of the gate groove, a bottom side of the sidewall spacers being disposed above an upper side of the lower portion of the gate groove.

12. The integrated circuit of claim 5, further comprising sidewall spacers made of an insulating material and formed on sidewalls of the gate groove.

13. The integrated circuit of claim 12, wherein a bottom side of the sidewall spacers is at the same height as the interface between the lower portion of the gate groove and the metal or metal compound.

14. The integrated circuit of claim 12, wherein the sidewall spacers are disposed on the sidewalls of the upper portion of the gate groove, a bottom side of the sidewall spacers being disposed above an upper side of the lower portion of the gate groove.

15. The integrated circuit of claim 14, wherein a material of the upper portion of the gate groove comprises at least one selected from the group consisting of Ti, TiN, WN and W.

16. The integrated circuit of claim 15, wherein the metal or metal compound is formed as a conformally deposited layer.

17. An integrated circuit including a memory cell comprising:
   a storage capacitor comprising a storage electrode, a counter electrode and a capacitor dielectric disposed between the storage electrode and the counter electrode; and
   a transistor comprising:
      a channel region disposed in a semiconductor substrate between a first and second source/drain regions, wherein the first and the second source/drain region are formed adjacent to an upper surface of the semiconductor substrate and wherein the channel region has horizontal and vertical components with respect to the upper surface of the semiconductor substrate; and
      a gate groove formed in the upper surface of the semiconductor substrate adjacent to the channel region, the gate groove comprising an upper portion and a lower portion, the upper portion being adjacent to the lower portion;
      a gate dielectric layer disposed between the channel region and the gate groove,
      wherein the lower portion of the gate groove is filled with polysilicon and a metal or a metal compound is disposed in the upper portion of the gate groove, thereby forming a gate electrode;
      wherein an entire interface between polysilicon of the lower portion of the gate groove and the metal or metal compound is disposed below the upper surface of the semiconductor substrate;
      wherein a distance between a bottom side of the gate groove to the upper surface is larger than a distance between a bottom side of the first and second source/drain regions and the upper surface, respectively; and
      wherein the first source/drain region is connected with the storage electrode of said memory cell.

18. The integrated circuit of claim 17, wherein the channel region comprises a fin-region in which the channel region has the shape of a ridge, the ridge comprising a top side and two lateral sides in a cross section perpendicular to the channel direction being defined by a line connecting said first and second source/drain regions, wherein the top side is disposed beneath the upper surface of the semiconductor substrate and wherein in a cross section perpendicular to the channel direction the gate electrode is disposed along the top side and the two lateral sides of the channel region.

19. The integrated circuit of claim 17, wherein a portion of the metal or metal compound is disposed above the upper surface of the substrate.

20. The integrated circuit of claim 17, wherein the transistor further comprises sidewall spacers made of an insulating material and formed on sidewalls of the gate groove.

21. The integrated circuit of claim 20, wherein the sidewall spacers are disposed on the sidewalls of the upper portion of the gate groove, a bottom side of the sidewall spacers being disposed above an upper side of the lower portion of the gate groove.

22. A method of forming an integrated circuit comprising a memory cell comprising:
   forming a plurality of storage capacitors for storing information;
   forming a plurality of first and a second source/drain regions in the semiconductor substrate adjacent to an upper surface of the semiconductor substrate, a channel formed between each of the first and a corresponding one of the second source/drain regions, wherein the channel has horizontal and vertical components with respect to the upper surface of the semiconductor substrate and wherein each of the first source/drain regions connected with a storage electrode of a corresponding one of the storage capacitors,
   forming a plurality of gate electrodes,
   wherein providing the gate electrode comprises:
      forming a gate groove in the upper surface of the substrate so that finally a gate groove extends from the upper surface of the semiconductor substrate in a direction perpendicular to the upper surface of the semiconductor substrate, the gate groove comprising an upper portion and a lower portion, the upper portion being adjacent to the lower portion, a distance between a bottom side of the gate groove to the upper surface being larger than a distance between a bottom side of the first and second source/drain regions and the upper surface, respectively;
      forming a gate dielectric at an interface between the semiconductor substrate and the gate groove; and
      filling the lower portion of the gate groove with polysilicon and forming a metal or a metal compound in the upper portion of the gate groove such that an entire interface between polysilicon of the lower portion of the gate groove and the metal or metal compound is disposed below the upper surface of the semiconductor substrate.

23. The method of claim 22, wherein defining a gate groove in said substrate further comprises depositing a silicon dioxide layer on the substrate surface, defining an opening in the silicon dioxide layer and, subsequently, etching the substrate material taking the silicon dioxide layer as a hard mask.

24. The method of claim 22, wherein the metal or metal compound is formed by a conformal deposition method.

25. An integrated circuit comprising:
   a peripheral portion comprising a conductive line; and
   an array portion comprising memory cells, the peripheral portion and the array portion being disposed in different portions of a semiconductor substrate, respectively,
   individual ones of the memory cells comprising a transistor which is at least partially formed in the semiconductor substrate, the transistor comprising:
   a channel region disposed in the semiconductor substrate between a first and a second source/drain region, wherein the first and the second source/drain region are formed adjacent to an upper surface of the semiconductor substrate and wherein the channel region has horizontal and vertical components with respect to the upper surface of the semiconductor substrate;
   a gate groove formed in the semiconductor substrate adjacent to the channel region, the gate groove comprising an upper portion and a lower portion, the upper portion being adjacent to the lower portion; and a gate dielectric layer disposed between the channel region and the gate groove, wherein the lower portion of the gate groove is filled with polysilicon and a metal or a metal compound is disposed in the upper portion of the gate groove, thereby forming an array gate electrode; and wherein an entire interface between polysilicon of the lower portion of the gate groove and the metal or metal compound is disposed below the upper surface of the semiconductor substrate;

wherein the conductive line of the peripheral portion comprises the metal or the metal compound comprised by the array gate electrode.

* * * * *